United States Patent
Nomura et al.

(10) Patent No.: US 9,391,128 B2
(45) Date of Patent: Jul. 12, 2016

(54) LIGHT EMITTING DEVICE AND ELECTRONIC DEVICE

(71) Applicant: Semiconductor Energy Laboratory Co., Ltd., Atsugi-shi, Kanagawa-ken (JP)

(72) Inventors: Ryoji Nomura, Yamato (JP); Satoshi Seo, Kawasaki (JP); Yuji Iwaki, Atsugi (JP); Nozomu Sugisawa, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/224,485

(22) Filed: Mar. 25, 2014

(65) Prior Publication Data

US 2014/0203266 A1 Jul. 24, 2014

Related U.S. Application Data

(63) Continuation of application No. 11/452,998, filed on Jun. 15, 2006, now Pat. No. 8,729,795.

(30) Foreign Application Priority Data

Jun. 30, 2005 (JP) ................. 2005-191868

(51) Int. Cl.
*H01L 27/32* (2006.01)
*H01L 51/50* (2006.01)
*H01L 51/52* (2006.01)

(52) U.S. Cl.
CPC .......... *H01L 27/326* (2013.01); *H01L 51/5092* (2013.01); *H01L 51/5265* (2013.01); *H01L 51/5052* (2013.01)

(58) Field of Classification Search
CPC ............ H01L 51/5209; H01L 51/5525; H01L 27/3246; H01L 27/3283
USPC ................. 257/79–103, E33.001–E33.077; 438/22–47, 99; 313/498–512
See application file for complete search history.

(56) References Cited

U.S. PATENT DOCUMENTS

| 5,144,288 A | 9/1992 | Hamada et al. |
| 5,670,792 A | 9/1997 | Utsugi et al. |

(Continued)

FOREIGN PATENT DOCUMENTS

| EP | 0 855 848 | 7/1998 |
| EP | 1 052 708 | 11/2000 |

(Continued)

OTHER PUBLICATIONS

Nakada et al., "Multi Photon Emission Organic EL Devices Using Charge-Transfer Complex as Charge Generation Layer," $63^{rd}$ Applied Physics-Related Combined Seminar Seminar Proceedings, Sep. 1, 2002.

(Continued)

*Primary Examiner* — Eric Ward
(74) *Attorney, Agent, or Firm* — Robinson Intellectual Property Law Office; Eric J. Robinson

(57) ABSTRACT

Color purity of a light emitting element is improved without an adverse effect such as reduction in voltage and luminance efficiency. The light emitting element has a light emitting laminated body including a light emitting layer between a pair of electrodes. A buffer layer is provided to be in contact with at least one of the electrodes. One of the electrodes is an electrode having high reflectance and the other is a translucent electrode. By employing a translucent electrode, light can be transmitted and reflected. An optical distance between the electrodes is adjusted in accordance with a thickness of the buffer layer, and accordingly, light can be resonated between the electrodes. The buffer layer is made of a composite material including an organic compound and a metal compound; therefore, voltage and luminance efficiency of the light emitting element is not affected even if a distance between the electrodes becomes long.

19 Claims, 14 Drawing Sheets

(56) References Cited

U.S. PATENT DOCUMENTS

| | | |
|---|---|---|
| 5,780,174 A | 7/1998 | Tokito et al. |
| 5,837,391 A | 11/1998 | Utsugi |
| 5,989,737 A | 11/1999 | Xie et al. |
| 6,013,384 A | 1/2000 | Kido et al. |
| 6,091,195 A | 7/2000 | Forrest et al. |
| 6,111,274 A | 8/2000 | Arai |
| 6,124,024 A | 9/2000 | Hosokawa et al. |
| 6,140,764 A | 10/2000 | Xu et al. |
| 6,366,025 B1 | 4/2002 | Yamada |
| 6,384,529 B2 | 5/2002 | Tang et al. |
| 6,423,429 B2 | 7/2002 | Kido et al. |
| 6,454,966 B1 | 9/2002 | Kobayashi et al. |
| 6,486,601 B1 | 11/2002 | Sakai et al. |
| 6,505,901 B1 | 1/2003 | Fukuda |
| 6,541,130 B2 | 4/2003 | Fukuda |
| 6,573,650 B2 | 6/2003 | Aoki et al. |
| 6,589,673 B1 | 7/2003 | Kido et al. |
| 6,639,250 B1 | 10/2003 | Shimoda et al. |
| 6,650,047 B2 | 11/2003 | Aoki et al. |
| 6,680,570 B2 | 1/2004 | Roitman et al. |
| 6,903,506 B2 | 6/2005 | Kita et al. |
| 6,906,457 B2 | 6/2005 | Song et al. |
| 6,956,323 B2 | 10/2005 | Kawaguchi et al. |
| 6,969,948 B2 * | 11/2005 | Urabe et al. ............ 313/506 |
| 6,971,938 B2 | 12/2005 | Urabe et al. |
| 7,019,331 B2 | 3/2006 | Winters et al. |
| 7,023,013 B2 | 4/2006 | Ricks et al. |
| 7,030,553 B2 | 4/2006 | Winters et al. |
| 7,057,339 B2 | 6/2006 | Boroson et al. |
| 7,102,282 B1 | 9/2006 | Yamada et al. |
| 7,122,845 B2 | 10/2006 | Uchida |
| 7,148,502 B2 * | 12/2006 | Yamazaki et al. ............ 257/40 |
| 7,173,373 B2 | 2/2007 | Yamada et al. |
| 7,196,469 B2 | 3/2007 | Shore et al. |
| 7,223,641 B2 | 5/2007 | Maekawa |
| 7,285,905 B2 * | 10/2007 | Hanawa et al. ............ 313/504 |
| 7,304,428 B2 | 12/2007 | Ghosh et al. |
| 7,323,225 B2 | 1/2008 | Aoki et al. |
| 7,365,488 B2 | 4/2008 | Lee et al. |
| 7,400,088 B2 * | 7/2008 | Ryu ............ 313/504 |
| 7,470,933 B2 * | 12/2008 | Lee et al. ............ 257/79 |
| 7,541,734 B2 | 6/2009 | Yamazaki et al. |
| 7,893,427 B2 | 2/2011 | Kumaki et al. |
| 8,008,652 B2 | 8/2011 | Kumaki et al. |
| 8,202,630 B2 | 6/2012 | Kumaki et al. |
| 8,368,059 B2 | 2/2013 | Kumaki et al. |
| 8,368,060 B2 | 2/2013 | Kumaki et al. |
| 8,455,114 B2 | 6/2013 | Kumaki et al. |
| 2002/0024051 A1 | 2/2002 | Yamazaki et al. |
| 2003/0044639 A1 | 3/2003 | Fukuda |
| 2003/0189401 A1 | 10/2003 | Kido et al. |
| 2004/0004434 A1 | 1/2004 | Nishi et al. |
| 2004/0145303 A1 | 7/2004 | Yamada et al. |
| 2004/0217697 A1* | 11/2004 | Lee et al. ............ 313/504 |
| 2005/0012455 A1 | 1/2005 | Lee et al. |
| 2005/0023969 A1* | 2/2005 | Omata ............ H01L 27/3246 313/504 |
| 2005/0037234 A1 | 2/2005 | Kim et al. |
| 2005/0040756 A1* | 2/2005 | Winters et al. ............ 313/504 |
| 2005/0040762 A1 | 2/2005 | Kurihara |
| 2005/0062057 A1 | 3/2005 | Yamazaki et al. |
| 2005/0067954 A1 | 3/2005 | Nishikawa et al. |
| 2005/0073247 A1 | 4/2005 | Yamazaki et al. |
| 2005/0077816 A1 | 4/2005 | Yamada et al. |
| 2005/0084712 A1 | 4/2005 | Kido et al. |
| 2005/0084713 A1 | 4/2005 | Kido et al. |
| 2005/0088085 A1 | 4/2005 | Nishikawa et al. |
| 2005/0098207 A1 | 5/2005 | Matsumoto et al. |
| 2005/0099113 A1 | 5/2005 | Yamada |
| 2005/0106419 A1* | 5/2005 | Endoh et al. ............ 428/690 |
| 2005/0110397 A1* | 5/2005 | Masuda ............ 313/504 |
| 2005/0140288 A1 | 6/2005 | Suzuki |
| 2005/0140291 A1* | 6/2005 | Hirakata et al. ............ 313/512 |
| 2005/0142976 A1* | 6/2005 | Suzuki ............ 445/24 |
| 2005/0170208 A1 | 8/2005 | Yatsunami et al. |
| 2005/0208330 A1 | 9/2005 | Raychaudhuri et al. |
| 2005/0212841 A1* | 9/2005 | Okano ............ B41J 2/01 347/13 |
| 2005/0225232 A1* | 10/2005 | Boroson et al. ............ 313/504 |
| 2005/0248267 A1 | 11/2005 | Gyoutoku et al. |
| 2005/0249972 A1 | 11/2005 | Hatwar et al. |
| 2005/0249974 A1 | 11/2005 | Mori et al. |
| 2005/0280008 A1 | 12/2005 | Ricks et al. |
| 2006/0008740 A1 | 1/2006 | Kido et al. |
| 2006/0033425 A1 | 2/2006 | Miura et al. |
| 2006/0138945 A1 | 6/2006 | Wolk et al. |
| 2006/0170339 A1* | 8/2006 | Kanno et al. ............ 313/506 |
| 2006/0183625 A1 | 8/2006 | Miyahara |
| 2006/0226767 A1 | 10/2006 | Tyan et al. |
| 2006/0284204 A1 | 12/2006 | Yamazaki et al. |
| 2007/0075627 A1 | 4/2007 | Kimura et al. |
| 2007/0102737 A1 | 5/2007 | Kashiwabara et al. |
| 2007/0114527 A1 | 5/2007 | Kumaki et al. |
| 2007/0131948 A1 | 6/2007 | Seo et al. |
| 2007/0182317 A1 | 8/2007 | Kido et al. |
| 2007/0200125 A1 | 8/2007 | Ikeda et al. |
| 2009/0206726 A1 | 8/2009 | Yamazaki et al. |
| 2011/0156030 A1 | 6/2011 | Kumaki et al. |
| 2011/0309351 A1 | 12/2011 | Kumaki et al. |
| 2013/0119425 A1 | 5/2013 | Kumaki et al. |

FOREIGN PATENT DOCUMENTS

| | | |
|---|---|---|
| EP | 1 089 361 | 4/2001 |
| EP | 1 128 438 | 8/2001 |
| EP | 1 154 676 | 11/2001 |
| EP | 1 351 558 A | 10/2003 |
| EP | 1 443 806 A | 8/2004 |
| EP | 1 524 706 A | 4/2005 |
| EP | 1 530 245 | 5/2005 |
| EP | 1 531 501 A | 5/2005 |
| JP | 03-274695 | 12/1991 |
| JP | 09-063771 | 3/1997 |
| JP | 09-180883 A | 7/1997 |
| JP | 10-270172 | 10/1998 |
| JP | 11-307259 | 11/1999 |
| JP | 11-307264 | 11/1999 |
| JP | 2000-315580 | 11/2000 |
| JP | 2000-323277 | 11/2000 |
| JP | 2001-244079 | 9/2001 |
| JP | 2002-056973 | 2/2002 |
| JP | 2002-520801 | 7/2002 |
| JP | 2002-359076 | 12/2002 |
| JP | 2003-109775 A | 4/2003 |
| JP | 2003-142277 | 5/2003 |
| JP | 2003-272860 A | 9/2003 |
| JP | 2003-280556 A | 10/2003 |
| JP | 2004-119201 | 4/2004 |
| JP | 2004-192890 | 7/2004 |
| JP | 2004-247137 | 9/2004 |
| JP | 2004-355975 | 12/2004 |
| JP | 2005-026121 | 1/2005 |
| JP | 2005-032618 | 2/2005 |
| JP | 2005-093396 | 4/2005 |
| JP | 2005-093401 | 4/2005 |
| JP | 2005-123095 A | 5/2005 |
| JP | 2005-129519 A | 5/2005 |
| JP | 2005-156871 | 6/2005 |
| JP | 2005-166637 | 6/2005 |
| JP | 2005-166641 A | 6/2005 |
| JP | 2005-302313 | 10/2005 |
| JP | 2005-322435 | 11/2005 |
| WO | WO 00/04594 | 1/2000 |
| WO | WO 01/15244 | 3/2001 |
| WO | WO 2005/031798 | 4/2005 |

OTHER PUBLICATIONS

Korean Office Action (Application No. 2006-0060956) Dated Aug. 21, 2012.

(56) References Cited

OTHER PUBLICATIONS

Harada et al., "New Delta Arranged Cell Configuration of AC Plasma Display "DIA-PDP" for High Luminous Efficiency and High Resolution," Electronics and Communications in Japan, Part 2, vol. 87, No. 2, 2004; pp. 9-17.

Adamovich et al., "TiN as an Anode Material for Organic Light-Emitting Diodes," Advanced Materials, vol. 11, No. 9, 1999, pp. 727-730.

Kashiwabara et al., "Late News Paper: Advanced AM-OLED Display Based on White Emitter with Microcavity Structure," SID 04 Digest, No. 29.5L, 2004, pp. 1017-1019.

* cited by examiner

LIGHT EMITTING DEVICE AND ELECTRONIC DEVICE

BACKGROUND OF THE INVENTION

1. Field of the Invention

The present invention relates to a light emitting element which emits light by feeding current and a light emitting device using the light emitting element.

2. Description of the Related Art

A light emitting device using a light emitting element having a layer including an organic material between a pair of electrodes which emits light by feeding current between the electrodes has been developed. Such a light emitting device is advantageous to be a thin shape and lightweight compared with other display devices which are referred to as thin display devices, has favorable visibility because of self-light emission, and has high response speed. Therefore, the light emitting devices are actively developed as display devices for the next generation, and at the present day, part of the light emitting devices is in practical use.

In such a light emitting element, holes are injected from an electrode which functions as an anode and electrons are injected from an electrode which functions as a cathode in a layer including an organic material. Then, a light emitting material in the layer including an organic material is excited by recombining holes and electrons, and light corresponding to the difference in energy between a ground state and an excited state is emitted when the light emitting material returns to a ground state.

Such a light emitting device which is advantageous to be a thin shape and lightweight is especially suitable for application of a mobile device. The lower power consumption of a light emitting device mounted to a mobile device in which there is a limitation in battery, the better, and power saving is always requested. In addition, a requirement of reducing energy consumption is more and more increased in association with an environmental problem, an energy problem, and the like in a television, a display, and the like in addition to a mobile device.

In particular, a television, a display, or the like with beauty in an image is a deserved requirement for a consumer now. One of the factors which affect beauty in an image is color reproductivity. In a case of a full-color display device, all colors are reproduced using three colors of red, green, and blue, or four colors of red, green, blue, and white. A bright display can be obtained by using a material which emits light with a wavelength having higher color purity; however, there are only a few materials with both high color purity and high reliability in the present situation.

The enhancement of external extraction efficiency of light emitted from a light emitting element is also effective for reducing power consumption. Patent Document 1 (Patent Document 1: Japanese Patent Laid-Open No. 2000-323277) mentions that, to enhance external extraction efficiency of light, each layer of an organic compound material layer except for a light emitting layer is set to have a different thickness corresponding to luminescent color and a reflection interference phenomenon is utilized, and accordingly, extraction efficiency of each color is enhanced. Patent Document 2 (Patent Document 2: Japanese Patent Laid-Open No. 2003-142277) mentions that each transparent electrode is set to have a different thickness corresponding to luminescent color and an interference phenomenon of reflected light is utilized, and accordingly, extraction efficiency of each color is enhanced.

However, in the structure in Patent Document 1, voltage and luminance efficiency is reduced in a case where a thickness of each layer of the organic compound material layer is set in consideration of a reflection interference phenomenon, while the thickness of each layer of the organic compound material layer is necessary to be set so that the function thereof is shown essentially. In addition, in the structure in Patent Document 2, the reduction in voltage and luminance efficiency is small. However, in order to form a transparent electrode corresponding to each color, the number of processes is increased because one of the electrodes of the light emitting element is formed so as to form a transparent electrode corresponding to each color, and productivity is very low. Thus, it is an object of the present invention to improve color purity of a light emitting element without reduction in voltage and luminance efficiency and current and luminance efficiency.

As described above, it is favorable as power consumption is lower, and the present situation is far from a situation that low power consumption is sufficiently attained. Therefore, power consumption is desired to be further lowered. Thus, it is another object of the present invention to provide a light emitting element and a light emitting device capable of lowering power consumption.

SUMMARY OF THE INVENTION

It is another object of the present invention to provide a light emitting element and a light emitting device which can achieve both low power consumption and the improvement of color purity without appearance of an adverse effect such as reduction in voltage and luminance efficiency.

To accomplish the above-described objects, one feature of the present invention is a light emitting device including a light emitting element having a pair of electrodes and a layer including an organic compound interposed between the pair of electrodes. The layer including an organic compound includes at least a light emitting layer including a light emitting substance, and a buffer layer having a composite material including an organic compound which shows a hole transporting property and a metal compound, and one of the pair of electrodes is an electrode having high reflectance and the other is a translucent electrode.

Another feature of the present invention is that a thickness of the buffer layer of the light emitting element is determined so that intensity of light emitted to outside the light emitting element becomes high. An emission spectrum of a light emitting layer or a light emitting substance and an emission spectrum of a light emitting element may be compared with each other in order to examine whether emission intensity of the light emitting element is heightened. When a half value width of an emission spectrum of the former is narrower than that of the latter, emission intensity is heightened. More specifically, when the half value width of an emission spectrum of the former is in the range of 80% or less, and 30% or more and 80% or less of the half value width of the latter, it can be considered that emission intensity of the light emitting element is heightened.

In the above-described structure, another feature of the present invention is a light emitting element in which an optical distance between the pair of electrodes is an integral multiple of half of a maximum wavelength of light extracted to outside the light emitting element from the light emitting element.

In the above-described structure, another feature of the present invention is that an optical distance between the pair of electrodes is an integral multiple of half of a wavelength of light which is desired to be extracted from the light emitting element. Naturally, in the present invention, an optical distance between the pair of electrodes includes discrepancy which is to be allowed. This is because it is difficult for the optical distance between the pair of electrodes to be strictly conformed to an integral multiple of a half-wavelength of a predetermined wavelength (maximum wavelength of light emitted from a light emitting element or wavelength of light which is desired to be emitted from a light emitting element) due to accuracy of a film formation apparatus in controlling a thickness. Accordingly, the present invention includes discrepancy of the optical distance between the pair of electrodes if the discrepancy is in the range of ±5%, which is discrepancy of a thickness generated in a film formation apparatus (in-plane distribution).

According to the light emitting device of the present invention, one of the electrodes of the light emitting element is a translucent electrode having reflectivity and a light transmitting property, and the other is an electrode having reflectivity in order to use so called microcavity effect, in which light emitted from the light emitting layer is reflected repeatedly between the pair of electrodes. The translucent electrode is an electrode having transmittance in the range of 40% or more and 90% or less and reflectance is 10% or more, preferably 20% or more, with respect to light emitted from the light emitting layer.

The electrode having high reflectance is an electrode having reflectance of 40% or more, preferably 70% or more, with respect to light emitted from the light emitting layer.

In the above-described structure, another feature of the present invention is that the buffer layer is in contact with one of the pair of electrodes. In a case where two buffer layers are provided, it is preferable to provide the buffer layer to be in contact with each of the pair of electrodes. In the present invention, a metal compound included in the buffer layer is oxide or nitride of a transition metal.

In addition, a metal compound included in the buffer layer is oxide or nitride of metal belonging to Groups 4 to 8 in the periodic table.

Further, the metal compound included in the buffer layer is any of vanadium oxide, tantalum oxide, molybdenum oxide, tungsten oxide, rhenium oxide, and ruthenium oxide.

According to the light emitting element and the light emitting device of the present invention, low power consumption and the improvement of color purity can be easily achieved at the same time without appearance of an adverse effect such as reduction in voltage and luminance efficiency.

DETAILED DESCRIPTION OF THE INVENTION

Hereinafter, embodiment modes according to the present invention will be explained in detail with reference to the drawings. It is easily understood by those skilled in the art that embodiments and details herein disclosed can be modified in various ways without departing from the purpose and the scope of the present invention. Therefore, it should be noted that the description of embodiment modes should not be interpreted as being limited to the present invention.

Embodiment Mode 1

Figure 1A:
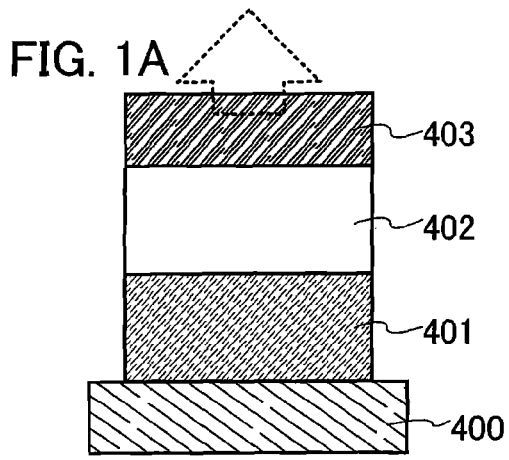
FIGS. 1A to 1F are cross-sectional frame formats of a light emitting element of the present invention.

FIG. 1A is a frame format showing one mode of a light emitting element of the present invention. In a light emitting element of the present invention in FIG. 1A, a layer including an organic compound formed by a buffer layer 401 and a light emitting laminated body 402 is sandwiched between a pair of electrodes composed of a first electrode 400 and a second electrode 403 over an insulator which is not shown. In FIG. 1A, a structure in which light is extracted from a second electrode 403 side will be explained.

Although the first electrode 400 may be formed to have a single layer or a multilayer, the first electrode 400 is formed to be an electrode having high reflectance. Although the second electrode 403 may be formed to have a single layer or a multilayer, the second electrode 403 is formed as a translucent electrode with respect to light emitted from the light emitting element. According to the light emitting element of the present invention, light emission can be obtained by applying a fixed voltage or more in a specific direction between the pair of electrodes.

In FIG. 1A, the buffer layer 401 is provided on a first electrode 400 side in the layer including an organic compound. In a case of a structure in which a voltage is applied so that an electric potential of the first electrode 400 is higher in obtaining light emission (in a case where the first electrode 400 is made to function as an anode), the buffer layer 401 is made of a composite material of an organic compound having a hole transporting property and a metal compound.

As the metal compound, oxide or nitride of a transition metal is desirable, and oxide or nitride of metal belonging to Groups 4 to 8 in the periodic table is more desirable. In particular, vanadium oxide, tantalum oxide, molybdenum oxide, tungsten oxide, rhenium oxide, and ruthenium oxide are preferable.

As the organic compound having a hole transporting property, an organic material having an arylamino group such as 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), or 4,4',4''-tris(N-carbazolyl)triphenylamine (abbreviation: TCTA); phthalocyanine (abbreviation: H$_2$Pc); copper phthalocyanine (CuPc); vanadyl phthalocyanine (abbreviation: VOPc); or the like can also be used.

In addition, such an organic material that will be represented by the following general formula (1) can also be preferably used as the organic compound having a hole transporting property. As the specific examples, 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and the like can be given. A first composite material using an organic compound having this structure is superior in thermal stability and has favorable reliability.

[Chemical 1]

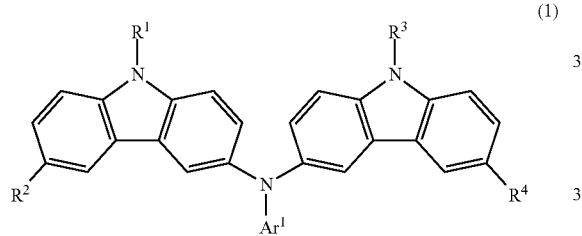

(1)

wherein $R^1$ and $R^3$ may be the same or different from each other and each represents any of hydrogen, an alkyl group having 1 to 6 carbon atoms, an aryl group having 6 to 25 carbon atoms, a heteroaryl group having 5 to 9 carbon atoms, an arylalkyl group, and an acyl group having 1 to 7 carbon atoms; $Ar^1$ represents any of an aryl group having 6 to 25 carbon atoms and a heteroaryl group having 5 to 9 carbon atoms; $R^2$ represents any of hydrogen, an alkyl group having 1 to 6 carbon atoms, and an aryl group having 6 to 12 carbon atoms; and $R^4$ represents any of hydrogen, an alkyl group having 1 to 6 carbon atoms, an aryl group having 6 to 12 carbon atoms, and a substituent that will be represented by a general formula (2). In the substituent represented by the general formula (2), $R^5$ represents any of hydrogen, an alkyl group having 1 to 6 carbon atoms, an aryl group having 6 to 25 carbon atoms, a heteroaryl group having 5 to 9 carbon atoms, an arylalkyl group, and an acyl group having 1 to 7 carbon atoms; $Ar^2$ represents any of an aryl group having 6 to 25 carbon atoms and a heteroaryl group having 5 to 9 carbon atoms; and $R^6$ represents any of hydrogen, an alkyl group having 1 to 6 carbon atoms, and an aryl group having 6 to 12 carbon atoms.

[Chemical 2]

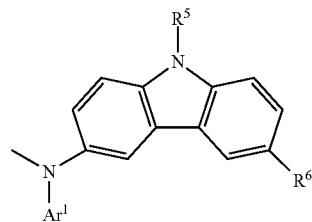

(2)

In addition, such an organic material that will be represented by any of the following general formulas (3) to (6) can also be preferably used as an organic compound having a hole transporting property. As the specific example of an organic compound that will be represented by any of the following general formulas (3) to (6), N-(2-naphthyl)carbazole (abbreviation: NCz), 4,4'-di(N-carbazolyl)biphenyl (abbreviation: CBP), 9,10-bis[4-(N-carbazolyl)phenyl]anthracene (abbreviation: BCPA), 3,5-bis[4-(N-carbazolyl)phenyl]biphenyl (abbreviation: BCPBi), 1,3,5-tris[4-(N-carbazolyl)phenyl]benzene (abbreviation: TCPB), and the like can be given.

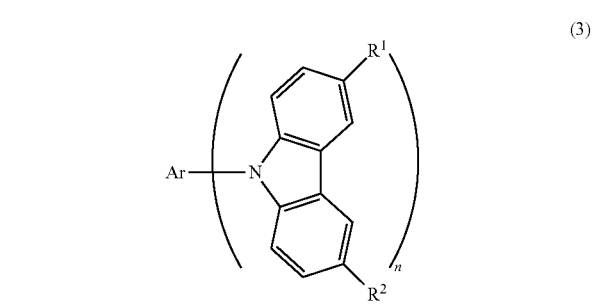

(3)

wherein Ar represents an aromatic hydrocarbon group having 6 to 42 carbon atoms; n represents a natural number of 1 to 3; and $R^1$ and $R^2$ represent hydrogen, an alkyl group having 1 to 4 carbon atoms, or an aryl group having 6 to 12 carbon atoms.

[Chemical 4]

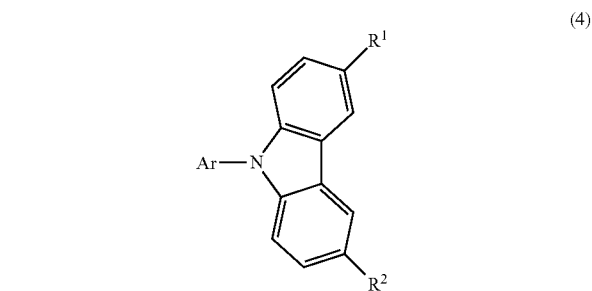

(4)

wherein Ar represents a monovalent aromatic hydrocarbon group having 6 to 42 carbon atoms; and $R^1$ and $R^2$ represent hydrogen, an alkyl group having 1 to 4 carbon atoms, or an aryl group having 6 to 12 carbon atoms.

[Chemical 5]

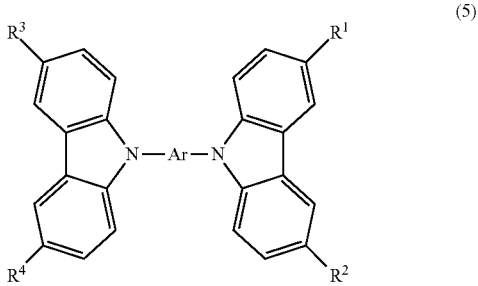

(5)

wherein Ar represents a bivalent aromatic hydrocarbon group having 6 to 42 carbon atoms; and $R^1$ to $R^4$ represent hydrogen, an alkyl group having 1 to 4 carbon atoms, or an aryl group having 6 to 12 carbon atoms.

[Chemical 6]

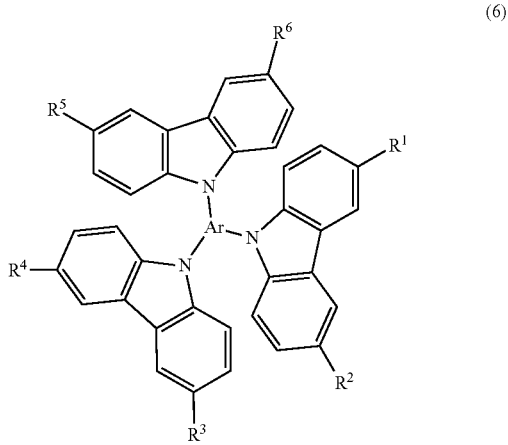

(6)

wherein Ar represents a trivalent aromatic hydrocarbon group having 6 to 42 carbon atoms; and $R^1$ to $R^6$ represents hydrogen, an alkyl group having 1 to 4 carbon atoms, or an aryl group having 6 to 12 carbon atoms.

Further, it is also possible to use an aromatic hydrocarbon such as anthracene, 9,10-diphenylanthracene (abbreviation: DPA), 2-tert-butyl-9,10-di(2-naphthyl)anthracene (abbreviation: t-BuDNA), tetracene, rubrene, or pentacene as the organic compound having a hole transporting property.

Although the buffer layer 401 can be manufactured by a co-evaporation method with the above metal compound and organic compound having a hole transporting property, the buffer layer 401 can also be formed by any of a wet method and other known methods. It is to be noted that, in the buffer layer 401, it is desirable that a weight ratio of the organic compound and the metal compound is 95:5 to 20:80, and preferably 90:10 to 50:50.

In a case where a voltage is applied so that an electric potential of the first electrode 400 is lower in obtaining light emission (in a case where the first electrode is made to function as a cathode), the buffer layer 401 is formed as a two-layer structure. In specific, a layer having a function for generating electrons is further provided on a light emitting laminated body 402 side. The layer having a function for generating electrons may be made of a transparent conductive material or a composite material of an organic compound having an electron transporting property and a donor compound.

As the donor compound, alkali metal and alkali earth metal, or oxide and nitride including these is desirable, and specifically, lithium, sodium, potassium, cesium, magnesium, calcium, strontium, barium, lithium oxide, magnesium nitride, or calcium nitride is preferable. In addition, as the organic compound having an electron transporting property, for example, a metal complex or the like having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq) can be used.

Besides, a material such as a metal complex having an oxazole-based ligand or a thiazole-based ligand such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$) can also be used as the donor compound. Further, other than the metal complex, 2-(4-biphenylyl)-5-(4-tert-buthylphenyl)-1,3,4-oxadiazole (abbreviation: PBD), 1,3-bis[5-(p-tert-buthylphenyl)-1,3,4-oxadiazol-2-yl]benzene (abbreviation: OXD-7), 3-(4-tert-buthylphenyl)-4-phenyl-5-(4-biphenylyl)-1,2,4-triazole (abbreviation: TAZ), 3-(4-tert-buthylphenyl)-4-(4-ethylpheyl)-5-(4-biphenylyl)-1,2,4-triazole (abbreviation: p-EtTAZ), bathophenanthroline (abbreviation: BPhen), bathocuproin (abbreviation: BCP), or the like can be used as the donor compound.

The layer having a function for generating electrons may be manufactured by a known method such as a sputtering method or an evaporation method. The composite material can be formed by a co-evaporation method.

The buffer layer 401 has a role to adjust a light path length of light by adjusting a thickness of the buffer layer 401. By repeating reflection between both electrodes, light emitted from a light emitting layer goes and returns and is amplified to form a standing wave. A standing wave is generated at a desired wavelength by adjusting a thickness of the buffer layer 401, and accordingly, light is amplified and an emission spectrum is narrowed. As a result, higher luminance can be obtained in a case of feeding the same current. In other words, luminous efficiency can be improved. Further, color purity is also improved due to narrowing of a spectrum. As for the material described above, a drive voltage is hardly increased even if the material is formed to be thick so as to have a thickness equivalent to a length of a wavelength. Therefore, an optical design described above can be conducted.

In specific, an optical distance Lo between the first electrode 400 and the second electrode 403 in the present invention is set so as to be ½ of a wavelength of light which is desired to be extracted (maximum wavelength of light emitted from the light emitting element), namely an integral multiple of a half-wavelength. In other words, provided that a wavelength of light which is desired to be extracted (for example, a maximum wavelength of light emitted from the light emitting element) is λ, in a case where refractive index of the layer including an organic compound at a wavelength of λ is $n_λ$ and a physical distance between the first electrode 400 and the second electrode 403 is Lp, a thickness of the buffer layer 401 is adjusted so as to satisfy the following formula (1).

[Formula 1]

$$Lp = \frac{1}{n_\lambda} \times \frac{\lambda}{2} m \quad (1)$$

It is to be noted that, in a case where the layer including an organic compound is formed by a lamination of a plurality of layers each of which is different in refractive index, the sum of the products of refractive index at a wavelength of λ and a thickness of the layer, which are obtained in each layer, may be an integral multiple of a half-wavelength (λ/2).

According to the present invention, any one of the pair of electrodes is a translucent electrode, not a transparent electrode; therefore, further strong interference effect can be obtained, and low power consumption and the improvement of color purity can be obtained more efficiently.

Further, by providing the buffer layer 401 to be in contact with a top surface of the first electrode 400, unevenness which is unfortunately formed over the first electrode 400 can be relieved. Therefore, failure due to the unevenness of the electrode (short-circuit between electrodes or the like) can be suppressed.

Furthermore, the buffer layer 401 is formed to be in contact with the first electrode 400; therefore, a material for the first electrode 400 can be selected independently of a work function. In other words, in obtaining light emission, there is no limitation on an electrode material even if a higher voltage or a lower voltage is applied compared with the other electrode. The first electrode 400 is desirably made of a material having high reflectance (reflectance with respect to light which is desired to be extracted is 40 to 100%, preferably 70 to 100%) with small absorption.

In a case of forming the first electrode 400 to have a single layer, aluminum, silver, alloy of aluminum, alloy of silver, or the like can be preferably used. As the alloy of aluminum, alloy of aluminum and silicon (Al—Si), alloy of aluminum and titanium (Al—Ti), and the like are given. In addition, titanium, titanium nitride, chromium, molybdenum, or the like can be used.

In a case of forming the first electrode 400 to be a multilayer, as long as the material described above is used on the light emitting laminated body 402 side, any material which can maintain electrical contact may be used for other layers. In addition, the first electrode 400 may be provided closer to the light emitting laminated body 402 side than the material described above as long as a transparent conductive film as typified by ITO (indium tin oxide), ITO containing silicon (ITSO), IZO (indium zinc oxide) in which 2 to 20 wt % of zinc oxide (ZnO) is mixed into indium oxide, and tin oxide (SnO$_2$) is used. For example, an electrode having a laminated structure of ITO, silver, and ITO or the like may be used. The first electrode 400 can be manufactured by a known method such as a sputtering method or an evaporation method. It is to be noted that ITO containing silicon (ITSO) is also referred to as ITO containing silicon oxide because silicon is contained as silicon oxide in which silicon is combined with oxygen contained in ITO.

The second electrode 403 is formed to be a translucent electrode with respect to light emitted from the light emitting element (transmittance with respect to light which is desired to be extracted is 40 to 90%). The second electrode 403 is formed as a translucent electrode having reflectivity with small absorption as well as a light transmitting property so that light emitted from the light emitting layer is reflected repeatedly between the first electrode 400 and the second electrode 403. The translucent electrode is formed so that transmittance is in the range of 40% or more and 90% or less and reflectance is 10% or more, preferably 20% or more, with respect to light which is desired to be extracted.

In a case where the second electrode 403 is made to function as a cathode, the second electrode 403 is formed to be a thin film made of a conductive material having a low work function so as to have a desired light transmitting property. As the material for the second electrode 403, it is particularly preferable to use a material having high reflectance with small absorption as well as having a light transmitting property, and as such a material, aluminum, silver, alloy of aluminum and lithium, alloy of magnesium and silver, or the like is preferable. Although a thin film of these is preferably formed to have a thickness which can obtain a desired transmittance, specifically 1 nm or more and 20 nm or less, the thickness can be increased to approximately 25 nm. In addition, the second electrode 403 can be a lamination of a thin film of these and a transparent conductive film as typified by ITO, ITSO, IZO, or SnO$_2$. By forming such a lamination, the second electrode 403 has higher reflectance than a single layer of the transparent conductive film, which can transmit and reflect light.

In a case where the second electrode 403 is made to function as an anode, the second electrode 403 is formed to be a thin film made of a conductive material having a high work function so as to have a desired light transmitting property. A thin film of tantalum, chromium, molybdenum, titanium, titanium nitride, aluminum, or the like can be used for the second electrode. Although the second electrode is preferable to have a thickness of 1 nm or more and 20 nm or less, the thickness can be increased to approximately 25 nm. As described above, as the material for the second electrode 403, it is particularly preferable to use a material having high reflectance with small absorption as well as having a light transmitting property. In addition, the second electrode can be formed as a lamination of a thin film of these and a transparent conductive film as typified by ITO, ITSO, IZO, or SnO$_2$. By forming such a lamination, the second electrode 403 has higher reflectance than a single layer of the transparent conductive film, which can transmit and reflect light.

The second electrode 403 can be manufactured by a known method such as a sputtering method or an evaporation method.

The light emitting laminated body 402 is a layer formed to have a single layer or laminated structure having at least a light emitting layer (the single layer is also referred to as "light emitting laminated body" as a matter of convenience). As a structure of the light emitting layer, two types of structures are mainly given. One of the structures is a host-guest type in which a light emitting substance (dopant) is dispersed in a material (host) having larger band gap than the light emitting substance, and the other is a type formed by only a light emitting substance.

In addition, a functional layer can be provided, such as a hole transporting layer made of a material which is advantageous in transporting holes and a hole injecting layer made of a material which is advantageous in injecting holes between the light emitting layer and the anode, and an electrode transporting layer made of a material which is advantageous in transporting electrons and an electron injecting layer made of a material which is advantageous in injecting electrons between the light emitting layer and the cathode. In a case of providing a transporting layer, an injecting layer is formed closer to an electrode side than the transporting layer. In addition to these layers, a layer having other function may be provided, such as a blocking layer which is provided in order for electrons and holes to be recombined effectively in the light emitting layer. These functional layers may be provided or may not be provided, and may be formed as a layer having a plurality of the functions. In addition, a boundary between each of the layers is not necessary to be distinct.

It is to be noted that the buffer layer 401 and the light emitting layer in the light emitting laminated body 402 are desirably formed to be separated from each other, and a transporting layer of electrons or holes is desirably formed between the light emitting layer and the buffer layer 401.

A light emitting substance for forming the light emitting layer is not particularly limited, and a substance which has favorable luminous efficiency and can emit light at a desired emission wavelength may be used.

For example, when reddish emission is desired to be obtained, a material which exhibits emission with a peak from 600 to 680 nm in an emission spectrum such as 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyl-9-julolidine-9-yl)ethenyl]-4H-pyran (abbreviation: DCJT), 4-dicyanomethylene-2-tert-butyl-6-[2-(1,1,7,7-tetramethyl-julolidine-9-yl)ethenyl]-4H-pyran (abbreviation: DCJTB), periflanthene, 2,5-dicyano-1,4-bis[2-(10-methoxy-1,1,7,7-tetramethyljulolidine-9-yl)ethenyl]benzene, or the like can be used.

When greenish emission is desired to be obtained, a material which exhibits emission with a peak from 500 to 550 nm in an emission spectrum such as N,N'-dimethylquinacridone (abbreviation: DMQd), coumarin 6, coumarin 545T, tris(8-quinolinolato)aluminum (abbreviation: $Alq_3$), or the like can be used.

In addition, when bluish emission is desired to be obtained, a material which exhibits emission with a peak from 420 to 500 nm in an emission spectrum such as 9,10-bis(2-naphthyl)-tert-butylanthracene (abbreviation: t-BuDNA), 9,9'-bianthryl, 9,10-diphenylanthracene (abbreviation: DPA), 9,10-bis(2-naphthyl)anthracene (abbreviation: DNA), bis(2-methyl-8-quinolinolato)-4-phenylphenolato-gallium (abbreviation: BGaq), bis(2-methyl-8-quinolinolato)-4-phenylphenolato-aluminum (abbreviation: BAlq), or the like can be used.

As mentioned above, as well as a substance which emits fluorescence, a substance which emits phosphorescence such as bis[2-(3,5-bis(trifluoromethyl)phenyl)pyridinato-$N,C^{2'}$]iridium(III)picolinate (abbreviation: $Ir(CF_3 ppy)_2(pic)$), bis [2-(4,6-difluorophenyl)pyridinato-$N,C^{2'}$]iridium(III)acetylacetonate (abbreviation: FIr(acac)), bis[2-(4,6-difluorophenyl)pyridinato-$N,C^{2'}$]iridium(III)picolinate (abbreviation: FIr(pic)), tris(2-phenylpyridinato-$N,C^{2'}$)iridium (abbreviation: $Ir(ppy)_3$), or the like can also be used as the light emitting substance.

In addition, a substance which is used to put the light emitting substance into a dispersion state is not particularly limited. For example, a metal complex or the like such as bis[2-(2-hydroxyphenyl)pyridinato]zinc (abbreviation: $Znpp_2$) or bis[2-(2-hydroxyphenyl)benzoxazolato]zinc (abbreviation: ZnBOX) can be used as well as an anthracene derivative such as 9,10-di(2-naphthyl)-2-tert-butylanthracene (abbreviation: t-BuDNA) or a carbazole derivative such as 4,4'-di(N-carbazolyl) biphenyl (abbreviation: CBP).

As a specific example of a substance which can be used to form the hole injecting layer, a polymer or the like such as a phthalocyanine-based compound such as phthalocyanine (abbreviation: $H_2Pc$) or copper phthalocyanine (CuPc); or poly(ethylenedioxythiophene)/poly(styrene sulfonate) water solution (PEDOT/PSS) is given. The hole injecting layer can be formed by selecting a substance such that ionization potential becomes comparatively lower than that of the functional layer formed to be in contact with the hole injecting layer from substances each having a hole transporting property.

As a specific example of a substance which can be used to form the hole transporting layer, 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris [N,N-di(m-tolyl)amino]benzene (abbreviation: m-MTDAB), 4,4',4"-tris(N-carbazolyl)triphenylamine (abbreviation: TCTA), phthalocyanine (abbreviation: $H_2Pc$), copper phthalocyanine (abbreviation: CuPc), vanadyl phthalocyanine (abbreviation: VOPc), and the like are given. In addition, the hole transporting layer may be a layer of a multilayer structure formed by combining two or more of layers made of the substance described above.

As a specific example of a material which can be used to form the electron transporting layer, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), bathophenanthroline (abbreviation: BPhen), bathocuproin (abbreviation: BCP), 2,2',2"-(1,3,5-benzenetriyl)-tris(1-phenyl-1H-benzimidazole) (abbreviation: TPBI), 4,4-bis(5-methylbenzoxazol-2-yl)stilbene (abbreviation: BzOs), and the like are given as well as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), bis[2-(2-hydroxyphenyl)benzoxazolato]zinc (abbreviation: $Zn(BOX)_2$), and bis[2-(2-hydroxyphenyl)benzothiazolato]zinc (abbreviation: $Zn(BTZ)_2$). In addition, the electron transporting layer may be a layer of a multilayer structure formed by combining two or more of layers made of the substance described above.

As a specific example of a substance which can be used to form the electron injecting layer, an inorganic substance such as alkali metal, alkaline earth metal, fluoride of alkali metal, fluoride of alkaline earth metal, oxide of alkali metal, and oxide of alkaline earth metal is given.

In addition to the inorganic substance, a substance which can be used to form the electron transporting layer such as BPhen, BCP, p-EtTAZ, TAZ, or BzOs can also be used to form the electron injecting layer by selecting a substance having higher electron affinity than that of a substance used to form the electron transporting layer from these substances.

That is, the electron injecting layer can also be formed by selecting a substance such that electron affinity in the electron injecting layer is comparatively higher than electron affinity in the electron transporting layer from substances having an electron transporting property. It is to be noted that, in a case where a material of which an electron injecting property is not so high is used as an electrode serving as a cathode, the electron injecting layer is desirably formed by laminating metal having a low work function such as lithium, calcium, or barium over the electrode, or doping the electron transporting layer with metal having a low work function such as lithium, calcium, or barium.

These light emitting laminated bodies 402 can be manufactured by a known method typified by an evaporation method or a wet method.

According to the light emitting element of the present invention having the structure described above, low power consumption and the improvement of color purity can be easily achieved at the same time without appearance of an adverse effect such as reduction in voltage and luminance efficiency. Further, unevenness which is unfortunately formed over the first electrode 400 can be relieved. Therefore, failure due to the unevenness of the electrode (short-circuit between electrodes or the like) can be suppressed.

Figure 1B:
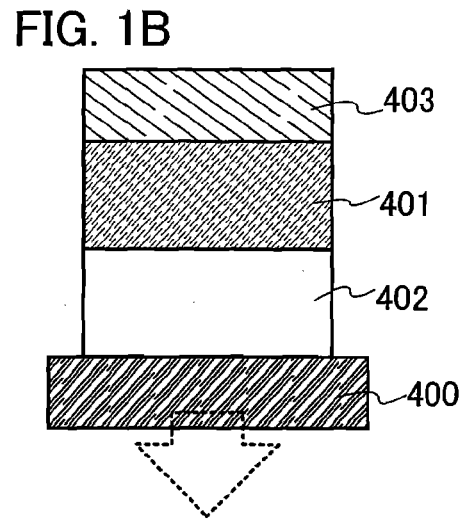

FIG. 1B is a frame format showing a mode of a light emitting element of the present invention which is different from FIG. 1A. In a light emitting element of the present invention in FIG. 1B, a layer including an organic compound formed by a buffer layer 401 and a light emitting laminated body 402 is sandwiched between a pair of electrodes composed of a first electrode 400 and a second electrode 403 over an insulator which is not shown. In FIG. 1B, a structure in which light is extracted from a first electrode 400 side will be explained.

Although the first electrode 400 may be formed to have a single layer or a multilayer, the first electrode 400 is formed to be a translucent electrode. Although the second electrode 403 may be formed to have a single layer or a multilayer, the second electrode 403 is formed to be an electrode having high reflectance with respect to light emitted from the light emitting element. According to the light emitting element of the present invention, light emission can be obtained by applying a fixed voltage or more in a specific direction between the pair of electrodes.

In FIG. 1B, the buffer layer 401 is provided on a second electrode 403 side in the layer including an organic compound. In a case of a structure in which a voltage is applied so that an electric potential of the second electrode 403 is higher in obtaining light emission (in a case where the second electrode 403 is made to function as an anode), the buffer layer 401 is made of a composite material of an organic compound having a hole transporting property and a metal compound.

In a case where a voltage is applied so that an electric potential of the second electrode 403 is lower in obtaining light emission (in a case where the second electrode 403 is made to function as a cathode), the buffer layer 401 is formed as a two-layer structure. In specific, a two-layer structure of a layer made of a composite material of an organic compound having a hole transporting property and a metal compound and a layer having a function for generating electrons is employed, and the layer having a function for generating electrons is provided on a light emitting laminated body 402 side. The layer having a function for generating electrons may be made of a transparent conductive material or a composite material of an organic compound having an electron transporting property and a donor compound.

A specific material and structure of the buffer layer 401 is the same as the buffer layer 401 in FIG. 1A; therefore, the repeated explanation will be omitted. Refer to the explanation of the buffer layer 401 in FIG. 1A. However, there is a difference in that an effect of relieving unevenness of the first electrode 400 cannot be obtained because the buffer layer 401 is not formed over an electrode to be formed in advance, namely the first electrode 400 in the structure in FIG. 1B.

The buffer layer 401 has a role to adjust a light path length of light by adjusting a thickness of the buffer layer 401. By repeating reflection between both electrodes, light emitted from a light emitting layer goes and returns and is amplified to form a standing wave. A standing wave is generated at a desired wavelength by adjusting a thickness of the buffer layer 401, and accordingly, light is amplified and an emission spectrum is narrowed. As a result, higher luminance can be obtained in a case of feeding the same current. In other words, luminous efficiency can be improved. Further, color purity is also improved due to narrowing of a spectrum. As for the material described above, a drive voltage is hardly increased even if the material is formed to be thick so as to have a thickness equivalent to a length of a wavelength. Therefore, an optical design described above can be conducted.

In specific, an optical distance Lo between the first electrode 400 and the second electrode 403 in the present invention is set so as to be ½ of a wavelength of light which is desired to be extracted (maximum wavelength of light emitted from the light emitting element), namely an integral multiple of a half-wavelength. In other words, provided that a wavelength of light which is desired to be extracted (maximum wavelength of light emitted from the light emitting element) is λ, in a case where refractive index of the layer including an organic compound at a wavelength of λ is $n_\lambda$ and a physical distance between the first electrode 400 and the second electrode 403 is Lp, a thickness of the buffer layer 401 is adjusted so as to satisfy the following formula (1).

[Formula 2]

$$Lp = \frac{1}{n_\lambda} \times \frac{\lambda}{2} m \tag{1}$$

It is to be noted that, in a case where the layer including an organic compound is formed by a lamination of a plurality of layers each of which is different in refractive index, the sum of the products of refractive index at a wavelength of λ and a thickness of the layer, which are obtained in each layer, may be an integral multiple of a half-wavelength (λ/2).

According to the present invention, any one of the pair of electrodes is a translucent electrode, not a transparent electrode; therefore, further strong interference effect can be obtained, and low power consumption and the improvement of color purity can be obtained more efficiently.

The first electrode 400 is formed to be a translucent electrode with respect to light emitted from the light emitting element (transmittance with respect to light which is desired to be extracted is 40 to 90%). The first electrode 400 is formed as a translucent electrode having reflectivity with small absorption as well as a light transmitting property so that light emitted from the light emitting layer is reflected repeatedly between the first electrode 400 and the second electrode 403. The translucent electrode is formed so that transmittance is in the range of 40% or more and 90% or less, and reflectance is 10% or more, preferably 20% or more, with respect to light which is desired to be extracted.

In a case where the first electrode 400 is made to function as a cathode, the first electrode 400 is formed to be a thin film made of a conductive material having a low work function so as to have a desired light transmitting property. As the material for the first electrode 400, it is particularly preferable to use a material having high reflectance with small absorption as well as having a light transmitting property, and as such a material, aluminum, silver, alloy of aluminum and lithium, alloy of magnesium and silver, or the like is preferable. Although a thin film of these is preferably formed to have a thickness which can obtain a desired transmittance, specifically 1 nm or more and 20 nm or less, the thickness can also be increased to approximately 25 nm. In addition, the first electrode 400 can be a lamination of a thin film of these and a transparent conductive film as typified by ITO, ITSO, IZO, or $SnO_2$.

In a case where the first electrode 400 is made to function as an anode, the first electrode 400 is formed to be a thin film made of a conductive material having a high work function so as to have a desired light transmitting property. As the material for the first electrode 400, a thin film of tantalum, chromium, molybdenum, titanium, titanium nitride, aluminum, or the like can be used. Although the first electrode 400 is preferable to have a thickness of 1 nm or more and 20 nm or less, the thickness can be increased to approximately 25 nm. The first electrode 400 can be formed to be a lamination of a thin film of these and a transparent conductive film as typified by ITO, ITSO, IZO, or $SnO_2$ so that the first electrode 400 is made to be an electrode having high reflectance with small absorption as well as having a light transmitting property.

The first electrode 400 can be manufactured by a known method such as a sputtering method or an evaporation method.

The buffer layer 401 is formed to be in contact with the second electrode 403; therefore, a material of the second electrode 403 can be selected independently of a work function. In other words, in obtaining light emission, there is no limitation on an electrode material even if a higher voltage or a lower voltage is applied compared with the other electrode.

The second electrode 403 is desirably made of a material having high reflectance (reflectance with respect to light which is desired to be extracted is 40 to 100%, preferably 70 to 100%) with small absorption. In a case of forming the second electrode 403 to have a single layer, aluminum, silver, alloy of aluminum, alloy of silver, or the like can be preferably used. As the alloy of aluminum, Al—Si, Al—Ti, and the like are given. In addition, titanium, titanium nitride, chromium, molybdenum, or the like can also be used.

In a case of forming the second electrode 403 to be a multilayer, as long as the material described above is used on the light emitting laminated body 402 side, any material which can maintain electrical contact may be used for other layers. In addition, the second electrode 403 may be provided closer to the light emitting laminated body 402 side than the material described above as long as a transparent conductive film as typified by ITO, ITSO, IZO, and $SnO_2$ is used. For example, an electrode having a laminated structure of ITO, silver, and ITO or the like may be used. The second electrode 403 can be manufactured by a known method such as a sputtering method or an evaporation method.

The light emitting laminated body 402 is the same as FIG. 1A; therefore, the repeated explanation will be omitted. Refer to the description of the light emitting laminated body 402 in FIG. 1A.

According to the light emitting element of the present invention having the structure described above, low power consumption and the improvement of color purity can be concurrently achieved easily without appearance of an adverse effect such as reduction in voltage and luminance efficiency.

Figure 1C:
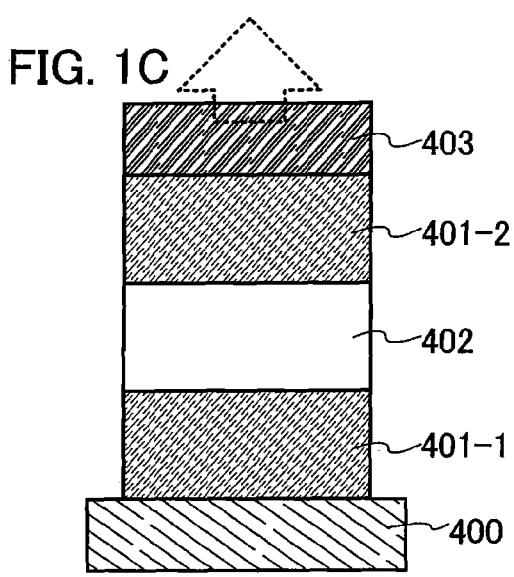

FIG. 1C is a frame format showing a mode of a light emitting element of the present invention which is different from FIG. 1A. In a light emitting element of the present invention in FIG. 1C, a layer including an organic compound formed by a buffer layer 401-1, a light emitting laminated body 402, and a buffer layer 401-2 is sandwiched between a pair of electrodes composed of a first electrode 400 and a second electrode 403 over an insulator which is not shown. In FIG. 1C, a structure in which light is extracted from a second electrode 403 side will be explained.

Although the first electrode 400 may be formed to have a single layer or a multilayer, the first electrode 400 is formed to be an electrode having high reflectance with respect to light emitted from the light emitting element. Although the second electrode 403 may be formed to have a single layer or a multilayer, the second electrode 403 is formed to be a translucent electrode with respect to light emitted from the light emitting element. According to the light emitting element of the present invention, light emission can be obtained by applying a fixed voltage or more in a specific direction between the pair of electrodes.

In FIG. 1C, the buffer layer 401-1 and the buffer layer 401-2 are provided on a first electrode 400 side and a second electrode 403 side in the layer including an organic compound, respectively. Among the buffer layer 401-1 and the buffer layer 401-2, the buffer layer, which is provided on an electrode side (electrode side which is made to function as an anode) to which a voltage is applied so that an electric potential is higher in obtaining light emission, is made of a composite material of an organic compound having a hole transporting property and a metal compound.

On the other hand, the buffer layer, which is provided on an electrode side (electrode side which is made to function as a cathode) to which a low voltage is applied in obtaining light emission, is formed as a two-layer structure of a layer made of a composite material of an organic compound having a hole transporting property and a metal compound and a layer having a function for generating electrons, and the layer having a function for generating electrons is provided on a light emitting laminated body 402 side.

The layer having a function for generating electrons may be made of a transparent conductive material or a composite material of an organic compound having an electron transporting property and a donor compound. A specific material and structure of the buffer layers 401-1 and 401-2 is the same as the buffer layer 401 in FIG. 1A; therefore, the repeated explanation will be omitted. Refer to the explanation of the buffer layer 401 in FIG. 1A.

The buffer layers 401-1 and 401-2 have a role to adjust a light path length of light by adjusting a thickness thereof. By repeating reflection between both electrodes, light emitted from a light emitting layer goes and returns and is amplified to form a standing wave. A standing wave is generated at a desired wavelength by adjusting a thickness/thicknesses of one or both of the buffer layers 401-1 and 401-2, and accordingly, light is amplified and an emission spectrum is narrowed. As a result, higher luminance can be obtained in a case of feeding the same current. In other words, luminous efficiency can be improved. Further, color purity is also improved due to narrowing of a spectrum. As for the material described above, a drive voltage is hardly increased even if the material is formed to be thick so as to have a thickness equivalent to a length of a wavelength. Therefore, an optical design described above can be conducted.

In specific, an optical distance Lo between the first electrode 400 and the second electrode 403 in the present invention is set so as to be ½ of a wavelength of light which is desired to be extracted (maximum wavelength of light emitted from the light emitting element), namely an integral multiple of a half-wavelength. In other words, provided that a wavelength of light which is desired to be extracted (maximum wavelength of light emitted from the light emitting element) is λ, in a case where refractive index of the layer including an organic compound at a wavelength of λ is $n_\lambda$ and a physical distance between the first electrode 400 and the second electrode 403 is Lp, a thickness/thicknesses of the buffer layer 401-1 or/and 401-2 is/are adjusted so as to satisfy the following formula (1).

[Formula 3]

$$Lp = \frac{1}{n_\lambda} \times \frac{\lambda}{2} m \qquad (1)$$

It is to be noted that, in a case where the layer including an organic compound is formed by a lamination of a plurality of layers each of which is different in refractive index, the sum of the products of refractive index at a wavelength of λ and a thickness of the layer, which are obtained in each layer, may be an integral multiple of a half-wavelength (λ/2).

According to the present invention, any one of the pair of electrodes is a translucent electrode, not a transparent electrode; therefore, further strong interference effect can be obtained, and low power consumption and the improvement of color purity can be obtained more efficiently.

Further, by providing the buffer layer 401-1 to be in contact with the first electrode 400, unevenness which is unfortunately formed over the first electrode 400 can be relieved. Therefore, failure due to the unevenness of the electrode (short-circuit between electrodes or the like) can be suppressed.

Furthermore, the first electrode 400 and the second electrode 403 are formed to be in contact with the buffer layers 401-1 and 402-1, respectively; therefore, a material can be selected independently of a work function. In other words, in obtaining light emission, there is no limitation on an electrode material even if a voltage is applied so that an electric potential is higher or lower compared with the other electrode.

As the first electrode 400, a material having high reflectance (reflectance with respect to light which is desired to be extracted is 40 to 100%, preferably 70 to 100%) with small absorption may be used. In a case of forming the first electrode 400 to have a single layer, aluminum, silver, alloy of aluminum, alloy of silver, or the like can be preferably used. As the alloy of aluminum, Al—Si, Al—Ti, and the like are given. In addition, titanium, titanium nitride, chromium, molybdenum, or the like also can be used.

In a case of forming the first electrode 400 to be a multilayer, as long as the material described above is used on the light emitting laminated body 402 side, any material which can maintain electrical contact may be used for other layers. In addition, the first electrode may be provided closer to the light emitting laminated body 402 side than the material described above as long as a transparent conductive film as typified by ITO, ITSO, IZO, and $SnO_2$ is used. For example, an electrode having a laminated structure of ITO, silver, and ITO or the like may be used. The first electrode 400 can be manufactured by a known method such as a sputtering method or an evaporation method.

The second electrode 403 is formed to be a translucent electrode with respect to light emitted from the light emitting element (transmittance with respect to light which is desired to be extracted is 40 to 90%). The second electrode 403 is formed as a translucent electrode having reflectivity with small absorption as well as a light transmitting property so that light emitted from the light emitting layer is reflected repeatedly between the first electrode 400 and the second electrode 403. The translucent electrode is formed so that transmittance is in the range of 40% or more and 90% or less and reflectance is 10% or more, preferably 20% or more, with respect to light which is desired to be extracted.

There is no limitation on a work function of the second electrode 403 because the buffer layer 401-2 is provided to be in contact with the second electrode 403, and the second electrode 403 may be formed to be a thin film made of a conductive material so as to have a desired light transmitting property. As the material for the second electrode 403, it is particularly preferable to use a material having high reflectance with small absorption as well as having a light transmitting property, and as such a material, aluminum, silver, alloy of aluminum and lithium, alloy of magnesium and silver, or the like is preferable. Although a thin film of these materials is preferably formed to have a thickness which can obtain a desired transmittance, specifically 1 nm or more and 20 nm or less, the thickness can be increased to approximately 25 nm. In addition, the second electrode 403 can be a lamination of a thin film of these and a transparent conductive film as typified by ITO, ITSO, IZO, or $SnO_2$. The second electrode 403 can be manufactured by a known method such as a sputtering method or an evaporation method.

The light emitting laminated body 402 is the same as FIG. 1A; therefore, the repeated explanation will be omitted. Refer to the description of the light emitting laminated body 402 in FIG. 1A.

According to the light emitting element of the present invention having the structure described above, low power consumption and the improvement of color purity can be easily achieved at the same time without appearance of an adverse effect such as reduction in voltage and luminance efficiency. Further, by providing the buffer layer 401-1 to be in contact with a top surface of the first electrode 400, unevenness which is unfortunately formed over the first electrode 400 can be relieved. Therefore, failure due to the unevenness of the electrode (short-circuit between electrodes or the like) can be suppressed.

Figure 1D:
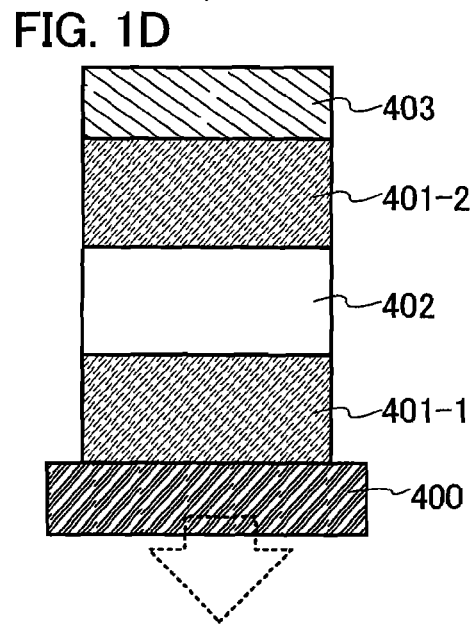

FIG. 1D is a frame format showing a mode of a light emitting element of the present invention which is different from FIG. 1A. In a light emitting element of the present invention in FIG. 1D, a layer including an organic compound formed by a buffer layer 401-1, a light emitting laminated body 402, and a buffer layer 401-2 is sandwiched between a pair of electrodes composed of a first electrode 400 and a second electrode 403 over an insulator which is not shown. In FIG. 1D, a structure in which light is extracted from a first electrode 400 side will be explained.

Although the first electrode 400 may be formed to have a single layer or a multilayer, the first electrode 400 is formed to be a translucent electrode with respect to light emitted from the light emitting element. Although the second electrode 403 may be formed to have a single layer or a multilayer, the second electrode 403 is formed to be an electrode having high reflectance with respect to light emitted from the light emitting element. According to the light emitting element of the present invention, light emission can be obtained by applying a fixed voltage or more in a specific direction between the pair of electrodes.

In FIG. 1D, the buffer layer 401-1 and the buffer layer 401-2 are provided on a first electrode 400 side and a second electrode 403 side in the layer including an organic compound, respectively. Among the buffer layer 401-1 and the buffer layer 401-2, the buffer layer, which is provided on an electrode side (electrode side which is made to function as an anode) to which a voltage is applied so that a voltage is higher in obtaining light emission, is made of a composite material of an organic compound having a hole transporting property and a metal compound.

On the other hand, the buffer layer, which is provided on an electrode side (electrode side which is made to function as a cathode) to which a low voltage is applied in obtaining light emission, is formed as a two-layer structure of a layer made of a composite material of an organic compound having a hole transporting property and a metal compound and a layer having a function for generating electrons, and the layer having a function for generating electrons is provided on a light emitting laminated body 402 side.

The layer having a function for generating electrons may be made of a transparent conductive material or a composite material of an organic compound having an electron transporting property and a donor compound. A specific material and structure of the buffer layers 401-1 and 401-2 is the same as the buffer layer 401 in FIG. 1A; therefore, the repeated explanation will be omitted. Refer to the explanation of the buffer layer 401 in FIG. 1A.

The buffer layers 401-1 and 401-2 have a role to adjust a light path length of light by adjusting a thickness thereof. By repeating reflection between both electrodes, light emitted from a light emitting layer goes and returns and is amplified to form a standing wave. A standing wave is generated at a desired wavelength by adjusting a thickness/thicknesses of one or both of the buffer layers 401-1 and 401-2, and accordingly, light is amplified and an emission spectrum is narrowed. As a result, higher luminance can be obtained in a case of feeding the same current. In other words, luminous efficiency can be improved. Further, color purity is also improved due to narrowing of a spectrum. As for the material described above, a drive voltage is hardly increased even if the material is formed to be thick so as to have a thickness equivalent to a length of a wavelength. Therefore, an optical design described above can be conducted.

In specific, an optical distance Lo between the first electrode 400 and the second electrode 403 in the present invention is set so as to be ½ of a wavelength of light which is desired to be extracted (maximum wavelength of light emitted from the light emitting element), namely an integral multiple of a half-wavelength. In other words, provided that a wavelength of light which is desired to be extracted (maximum wavelength of light emitted from the light emitting element) is λ, in a case where refractive index of the layer including an organic compound at a wavelength of λ is $n_\lambda$ and a physical distance between the first electrode 400 and the second electrode 403 is Lp, a thickness/thicknesses of the buffer layer 401-1 or/and 401-2 is/are adjusted so as to satisfy the following formula (1).

[Formula 4]

$$Lp = \frac{1}{n_\lambda} \times \frac{\lambda}{2} m \quad (1)$$

It is to be noted that, in a case where the layer including an organic compound is formed by a lamination of a plurality of layers each of which is different in refractive index, the sum of the products of refractive index at a wavelength of λ and a thickness of the layer, which are obtained in each layer, may be an integral multiple of a half-wavelength (λ/2).

According to the present invention, any one of the pair of electrodes is a translucent electrode, not a transparent electrode; therefore, further strong interference effect can be obtained, and low power consumption and the improvement of color purity can be obtained more efficiently.

Further, by providing the buffer layer 401-1 to be in contact with a top surface of the first electrode 400, unevenness which is unfortunately formed over the first electrode 400 can be relieved. Therefore, failure due to the unevenness of the electrode (short-circuit between electrodes or the like) can be suppressed.

The first electrode 400 and the second electrode 403 are formed to be in contact with the buffer layer 401-1 and the buffer layer 401-2, respectively; therefore, a material can be selected independently of a work function. In other words, in obtaining light emission, there is no limitation on an electrode material even if a higher voltage or a lower voltage is applied compared with the other electrode.

The first electrode 400 is formed to be a translucent electrode with respect to light emitted from the light emitting element (transmittance with respect to light which is desired to be extracted is 40 to 90%). The first electrode 400 is formed as a translucent electrode having reflectivity with small absorption as well as having a light transmitting property so that light emitted from the light emitting layer is reflected repeatedly between the first electrode 400 and the second electrode 403. The translucent electrode is formed so that transmittance is in the range of 40% or more and 90% or less, and reflectance is 10% or more, preferably 20% or more, with respect to light which is desired to be extracted.

There is no limitation on a work function of the first electrode 400 because the buffer layer 401-1 is provided to be in contact with the first electrode 400, and the first electrode 400 can be formed to be a thin film made of a conductive material so as to have a desired light transmitting property. As the material for the first electrode 400, it is particularly preferable to use a material having high reflectance with small absorption as well as having a light transmitting property, and as such a material, aluminum, silver, alloy of aluminum and lithium, alloy of magnesium and silver, or the like can be used. Although a thin film of these materials is preferably formed to have a thickness which can obtain a desired transmittance, specifically 1 nm or more and 20 nm or less, the thickness can be increased to approximately 25 nm. In addition, the first electrode 400 can be a lamination of a thin film of these and a transparent conductive film as typified by ITO, ITSO, IZO, or $SnO_2$. The first electrode 400 can be manufactured by a known method such as a sputtering method or an evaporation method.

There is no limitation on a work function of the second electrode 403 because the buffer layer 401-2 is provided to be in contact with the second electrode 403, and the second electrode 403 may be made of a material having high reflectance (reflectance with respect to light which is desired to be extracted is 40 to 100%, preferably 70 to 100%) with small absorption.

In a case of forming the second electrode 403 to have a single layer, aluminum, silver, alloy of aluminum, alloy of silver, or the like can be preferably used. As the alloy of aluminum, Al—Si, Al—Ti, and the like are given. In addition, titanium, titanium nitride, chromium, molybdenum, or the like can also be used.

In a case of forming the second electrode 403 to be a multilayer, as long as the material described above is used on the buffer layer 401-2 side, any material which can maintain electrical contact may be used for other layers. In addition, the second electrode 403 may be provided closer to the layer including an organic compound side than the material described above as long as a transparent conductive film as typified by ITO, ITSO, IZO, and $SnO_2$ is used. For example, an electrode having a laminated structure of ITO, silver, and ITO or the like may be used for the second electrode 403. The second electrode 403 can be manufactured by a known method such as a sputtering method or an evaporation method.

The light emitting laminated body 402 is the same as FIG. 1A; therefore, the repeated explanation will be omitted. Refer to the description of the light emitting laminated body 402 in FIG. 1A.

According to the light emitting element of the present invention having the structure described above, low power consumption and the improvement of color purity can be easily achieved at the same time without appearance of an adverse effect such as reduction in voltage and luminance efficiency. Further, unevenness which is unfortunately formed over the first electrode 400 can be relieved. Therefore, failure due to the unevenness of the electrode (short-circuit between electrodes or the like) can be suppressed.

Figure 1E:
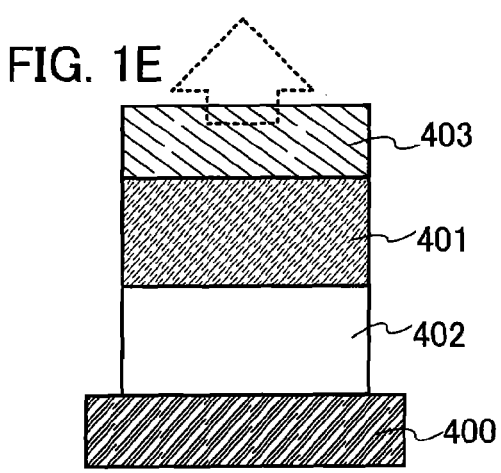

FIG. 1E is a frame format showing a mode of a light emitting element of the present invention which is different from FIG. 1A. In a light emitting element of the present invention in FIG. 1E, a layer including an organic compound formed by a buffer layer 401 and a light emitting laminated body 402 is sandwiched between a pair of electrodes composed of a first electrode 400 and a second electrode 403 over an insulator which is not shown. In FIG. 1E, a structure in which light is extracted from a second electrode 403 side will be explained.

Although the first electrode 400 may be formed to have a single layer or a multilayer, the first electrode 400 is formed to be an electrode having high reflectance with respect to light emitted from the light emitting element. Although the second electrode 403 may be formed to have a single layer or a multilayer, the second electrode 403 is formed to be a translucent electrode with respect to light emitted from the light emitting element. According to the light emitting element of the present invention, light emission can be obtained by applying a fixed voltage or more in a specific direction between the pair of electrodes.

In FIG. 1E, the buffer layer 401 is provided on a second electrode 403 side in the layer including an organic compound. In a case of a structure in which a voltage is applied so that an electric potential of the second electrode 403 is higher in obtaining light emission (in a case where the second electrode 403 is made to function as an anode), the buffer layer 401 is made of a composite material of an organic compound having a hole transporting property and a metal compound.

In a case where a voltage is applied so that an electric potential of the second electrode 403 is lower in obtaining light emission (in a case where the second electrode 403 is made to function as a cathode), the buffer layer 401 is formed as a two-layer structure. In specific, a layer having a function for generating electrons is further provided on a light emitting laminated body 402 side in the buffer layer 401.

The layer having a function for generating electrons may be made of a transparent conductive material or a composite material of an organic compound having an electron transporting property and a donor compound. A specific material and structure of the buffer layer 401 is the same as the buffer layer 401 in FIG. 1A; therefore, the repeated explanation will be omitted. Refer to the explanation of the buffer layer 401 in FIG. 1A. However, there is a difference in that an effect of relieving unevenness of the first electrode 400 cannot be obtained because the buffer layer 401 is not formed over an electrode to be formed in advance, namely the first electrode 400 in the structure in FIG. 1E.

The buffer layer 401 has a role to adjust a light path length of light by adjusting a thickness of the buffer layer 401. By repeating reflection between both electrodes, light emitted from a light emitting layer goes and returns and is amplified to form a standing wave. A standing wave is generated at a desired wavelength by adjusting a thickness of the buffer layer 401, and accordingly, light is amplified and an emission spectrum is narrowed. As a result, higher luminance can be obtained in a case of feeding the same current. In other words, luminous efficiency can be improved. Further, color purity is also improved due to narrowing of a spectrum. As for the material described above, a drive voltage is hardly increased even if the material is formed to be thick so as to have a thickness equivalent to a length of a wavelength. Therefore, an optical design described above can be conducted.

In specific, an optical distance Lo between the first electrode 400 and the second electrode 403 in the present invention is set so as to be ½ of a wavelength of light which is desired to be extracted (maximum wavelength of light emitted from the light emitting element), namely an integral multiple of a half-wavelength. In other words, provided that a wavelength of light which is desired to be extracted (maximum wavelength of light emitted from the light emitting element) is λ, in a case where refractive index of the layer including an organic compound at a wavelength of λ is $n_\lambda$ and a physical distance between the first electrode 400 and the second electrode 403 is Lp, a thickness of the buffer layer 401 is adjusted so as to satisfy the following formula (1).

[Formula 5]

$$Lp = \frac{1}{n_\lambda} \times \frac{\lambda}{2} m \qquad (1)$$

It is to be noted that, in a case where the layer including an organic compound is formed by a lamination of a plurality of layers each of which is different in refractive index, the sum of the products of refractive index at a wavelength of λ and a thickness of the layer, which are obtained in each layer, may be an integral multiple of a half-wavelength (λ/2).

According to the present invention, any one of the pair of electrodes is a translucent electrode, not a transparent electrode; therefore, further strong interference effect can be obtained, and low power consumption and the improvement of color purity can be obtained more efficiently.

The first electrode 400 is formed to be an electrode having high reflectance with respect to light emitted from the light emitting element.

In a case where the first electrode 400 is made to function as a cathode, the first electrode 400 is desirably made of a material having a low work function and high reflectance (reflectance with respect to light which is desired to be extracted is 40 to 100%, preferably 70 to 100%) with small absorption. In specific, alloy of aluminum and lithium, alloy of magnesium and silver, or the like can be used.

In a case where the first electrode 400 is made to function as an anode, a material having a high work function and high reflectance with small absorption is desirably used as a material for the first electrode 400. In specific, aluminum, silver, alloy of aluminum, alloy of silver, or the like can be preferably used. As the alloy of aluminum, Al—Si, Al—Ti, and the like are given. In addition, titanium, titanium nitride, chromium, molybdenum, or the like can be used. In a case of forming the first electrode 400 to be a multilayer, as long as the material described above is used on the light emitting laminated body 402 side, any material which can maintain electrical contact may be used for other layers.

In addition, in a case where the first electrode 400 is made to function as an anode, the first electrode may be provided closer to the light emitting laminated body 402 side than the material described above as long as a transparent conductive film as typified by ITO, ITSO, IZO, and $SnO_2$ is used. For example, an electrode having a laminated structure of ITO, silver, and ITO or the like may be used. These transparent conductive films have a high work function in many cases; therefore, by providing a transparent conductive film on the light emitting laminated body 402 side and providing a material having a low work function and high reflectance in the under portion thereof, an electrode having high reflectance can be obtained. The first electrode 400 can be manufactured by a known method such as a sputtering method or an evaporation method.

The second electrode 403 is formed to be a translucent electrode with respect to light emitted from the light emitting element (transmittance with respect to light which is desired to be extracted is 40 to 90%). The second electrode 403 is formed as a translucent electrode having reflectivity with small absorption as well as having a light transmitting property so that light emitted from the light emitting layer is reflected repeatedly between the first electrode 400 and the second electrode 403. The translucent electrode is formed so that transmittance is in the range of 40% or more and 90% or less, and reflectance is 10% or more, preferably 20% or more, with respect to light which is desired to be extracted.

There is no limitation on a work function of the second electrode 403 because the buffer layer 401 is provided to be in contact with the second electrode 403, and the second electrode 403 can be formed to be a thin film made of a conductive material so as to have a desired light transmitting property. As the material for the second electrode 403, it is particularly preferable to use a material having high reflectance with small absorption as well as having a light transmitting property, and as such a material, aluminum, silver, alloy of aluminum and lithium, alloy of magnesium and silver, or the like is preferable. Although a thin film of these is preferably formed to have a thickness which can obtain a desired transmittance, specifically 1 nm or more and 20 nm or less, the thickness can be increased to approximately 25 nm. In addition, the second electrode 403 can be a lamination of a thin film of these and a transparent conductive film as typified by ITO, ITSO, IZO, or $SnO_2$. The second electrode 403 can be manufactured by a known method such as a sputtering method or an evaporation method.

The light emitting laminated body 402 is the same as FIG. 1A; therefore, the repeated explanation will be omitted. Refer to the description of the light emitting laminated body 402 in FIG. 1A.

According to the light emitting element of the present invention having the structure described above, low power consumption and the improvement of color purity can be easily achieved at the same time without appearance of an adverse effect such as reduction in voltage and luminance efficiency.

Figure 1F:
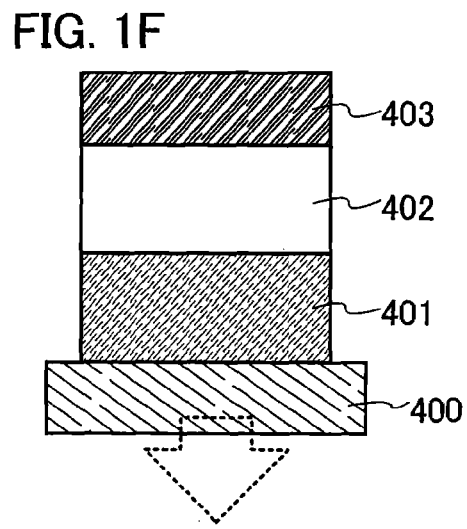

FIG. 1F is a frame format showing a mode of a light emitting element of the present invention which is different from FIG. 1A. In a light emitting element of the present invention in FIG. 1F, a layer including an organic compound made of a buffer layer 401 and a light emitting laminated body 402 is sandwiched between a pair of electrodes composed of a first electrode 400 and a second electrode 403 over an insulator which is not shown. In FIG. 1F, a structure in which light is extracted from a first electrode 400 side will be explained.

Although the first electrode 400 may be formed to have a single layer or a multilayer, the first electrode 400 is formed to be a translucent electrode with respect to light emitted from the light emitting element. Although the second electrode 403 may be formed to have a single layer or a multilayer, the second electrode 403 is formed to be an electrode having high reflectance with respect to light emitted from the light emitting element. According to the light emitting element of the present invention, light emission can be obtained by applying a fixed voltage or more in a specific direction between the pair of electrodes.

In FIG. 1F, the buffer layer 401 is provided on a first electrode 400 side in the layer including an organic compound. In a case of a structure in which a voltage is applied so that an electric potential of the first electrode 400 is higher in obtaining light emission (in a case where the first electrode 400 is made to function as an anode), the buffer layer 401 is made of a composite material of an organic compound having a hole transporting property and a metal compound. In addition, in a case where a voltage is applied so that an electric potential of the first electrode 400 is lower in obtaining light emission (in a case where the first electrode 400 is made to function as a cathode), the buffer layer 401 is formed as a two-layer structure of a layer made of a composite material of an organic compound having a hole transporting property and a metal compound and a layer having a function for generating electrons, and the layer having a function for generating electrons is provided on a light emitting laminated body 402 side. The layer having a function for generating electrons may be made of a transparent conductive material or a composite material of an organic compound having an electron transporting property and a donor compound. A specific material and structure of the buffer layer 401 is the same as the buffer layer 401 in FIG. 1A; therefore, the repeated explanation will be omitted. Refer to the explanation of the buffer layer 401 in FIG. 1A.

The buffer layer 401 has a role to adjust a light path length of light by adjusting a thickness of the buffer layer 401. By repeating reflection between both electrodes, light emitted from a light emitting layer goes and returns and is amplified to form a standing wave. A standing wave is generated at a desired wavelength by adjusting a thickness of the buffer layer 401, and accordingly, light is amplified and an emission spectrum is narrowed. As a result, higher luminance can be obtained in a case of feeding the same current. In other words, luminous efficiency can be improved. Further, color purity is also improved due to narrowing of a spectrum. As for the material described above, a drive voltage is hardly increased even if the material is formed to be thick so as to have a thickness equivalent to a length of a wavelength. Therefore, an optical design described above can be conducted.

In specific, an optical distance Lo between the first electrode 400 and the second electrode 403 in the present invention is set so as to be ½ of a wavelength of light which is desired to be extracted (maximum wavelength of light emitted from the light emitting element), namely an integral multiple of a half-wavelength. In other words, provided that a wavelength of light which is desired to be extracted (maximum wavelength of light emitted from the light emitting element) is λ, in a case where refractive index of the layer including an organic compound at a wavelength of λ is $n_λ$, a physical distance between the first electrode 400 and the second electrode 403 is Lp, a thickness of the buffer layer 401 is adjusted so as to satisfy the following formula (1).

[Formula 6]

$$Lp = \frac{1}{n_\lambda} \times \frac{\lambda}{2}m \quad (1)$$

It is to be noted that, in a case where the layer including an organic compound is formed by a lamination of a plurality of layers each of which is different in refractive index, the sum of the products of refractive index at a wavelength of λ and a thickness of the layer, which are obtained in each layer, may be an integral multiple of a half-wavelength (λ/2).

According to the present invention, any one of the pair of electrodes is a translucent electrode, not a transparent electrode; therefore, further strong interference effect can be obtained, and low power consumption and the improvement of color purity can be obtained more efficiently.

The first electrode 400 is formed to be a translucent electrode with respect to light emitted from the light emitting element (transmittance with respect to light which is desired to be extracted is 40 to 90%). The first electrode 400 is formed as a translucent electrode having reflectivity with small absorption as well as a light transmitting property so that light emitted from the light emitting layer is reflected repeatedly between the first electrode 400 and the second electrode 403. The translucent electrode is formed so that transmittance is in the range of 40% or more and 90% or less, and reflectance is 10% or more, preferably 20% or more, with respect to light which is desired to be extracted.

There is no limitation on a work function of the first electrode 400 because the buffer layer 401 is provided to be in contact with the first electrode 400, and the first electrode 400 can be formed to be a thin film made of a conductive material so as to have a desired light transmitting property. As the material for the first electrode 400, it is particularly preferable to use a material having high reflectance with small absorption as well as having a light transmitting property, and as such a material, aluminum, silver, alloy of aluminum and lithium, alloy of magnesium and silver, or the like is preferable. Although a thin film of these materials is preferably formed to have a thickness which can obtain a desired transmittance, specifically 1 nm or more and 20 nm or less, the thickness can be increased to approximately 25 nm. In addition, the first electrode 400 can be a lamination of a thin film of these and a transparent conductive film as typified by ITO, ITSO, IZO, or SnO$_2$. The first electrode 400 can be manufactured by a known method such as a sputtering method or an evaporation method.

The second electrode 403 is formed to be an electrode having high reflectance with respect to light emitted from the light emitting element. In a case where the second electrode 403 is made to function as a cathode, the second electrode 403 is desirably made of a material having a low work function and high reflectance (reflectance with respect to light which is desired to be extracted is 40 to 100%, preferably 70 to 100%) with small absorption. In specific, alloy of aluminum and lithium, alloy of magnesium and silver, or the like can be used.

In a case where the second electrode 403 is made to function as an anode, as a material thereof, a material having a high work function and high reflectance (reflectance with respect to light which is desired to be extracted is 40 to 100%, preferably 70 to 100%) with small absorption is desirably used. In specific, aluminum, silver, alloy of aluminum, alloy of silver, or the like can be preferably used. As the alloy of aluminum, Al—Si, Al—Ti, and the like are given. In addition, titanium, titanium nitride, chromium, molybdenum, or the like can be used. In a case of forming the second electrode 403 to be a multilayer, as long as the material described above is used on the light emitting laminated body 402 side, any material which can maintain electrical contact may be used for other layers.

In addition, in a case where the second electrode 403 is made to function as an anode, the second electrode 403 may be provided closer to the light emitting laminated body 402 side than the material described above as long as a transparent conductive film as typified by ITO, ITSO, IZO, and SnO$_2$ is used. For example, an electrode having a laminated structure of ITO, silver, and ITO or the like may be used. These transparent conductive films have a high work function in many cases; therefore, by providing a transparent conductive film on the light emitting laminated body 402 side and providing a material having a low work function and high reflectance in the under portion thereof, an electrode having high reflectance can be obtained. The second electrode 403 can be manufactured by a known method such as a sputtering method or an evaporation method.

The light emitting laminated body 402 is the same as FIG. 1A; therefore, the repeated explanation will be omitted. Refer to the description of the light emitting laminated body 402 in FIG. 1A.

According to the light emitting element of the present invention having the structure described above, low power consumption and the improvement of color purity can be easily achieved at the same time without appearance of an adverse effect such as reduction in voltage and luminance efficiency.

Embodiment Mode 2

In this embodiment mode, a manufacturing method of a light emitting device of the present invention will be explained with reference to FIGS. 2A to 2E, FIGS. 3A to 3C, and FIG. 4. It is to be noted that an example of manufacturing an active matrix light emitting device in which light is emitted to a second electrode side is shown in this embodiment mode. In a case of full color display using light emitting elements each having a different wavelength, the arrangement of a pixel of each color is not particularly limited, and desired arrangement such as stripe arrangement or delta arrangement can be applied. In particular, the delta arrangement in which each of the pixels are arranged in a delta array can be preferably applied in a case of using a light emitting element exhibiting three types of luminescent color such as red, green, and blue. The pixel of the delta arrangement is ideal for a light emitting device which displays an image such as a television.

As a matter of course, the present invention can be also applied to a light emitting device in which light is emitted to a first electrode side and a passive matrix light emitting device.

Figure 2A:
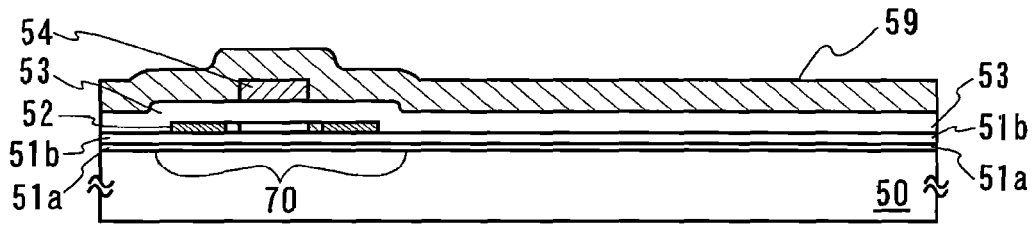
FIGS. 2A to 2E are cross-sectional frame formats each showing a manufacturing method of a light emitting device of the present invention.

First, after forming a first base insulating layer 51a and a second base insulating layer 51b over a substrate 50, a semiconductor layer is further formed over the second base insulating layer 51b (FIG. 2A).

As a material for the substrate 50, glass, quartz, plastic (polyimide, acrylic, polyethylene terephthalate, polycarbonate, polyacrylate, polyether sulfone, or the like), and the like can be used. These substrates may be polished by CMP or the like, if necessary. In this embodiment mode, a glass substrate is used.

The first and second base insulating layers 51a and 51b are provided to prevent elements that adversely affect the characteristics of the semiconductor film such as alkali metal and alkaline earth metal in the substrate 50 from dispersing into the semiconductor layer. The first and second base insulating layers 51a and 51b can be formed using silicon oxide, silicon nitride, silicon oxide containing nitrogen, silicon nitride containing oxygen, and the like. In this embodiment mode, the first base insulating layer 51a is made of silicon nitride while the second base insulating layer 51b is made of silicon oxide. In this embodiment mode, a base insulating film is formed to have two layers of the first and second base insulating layers 51a and 51b. However, the base insulating film may be formed to have a single layer or two or more layers. In addition, when the diffusion of impurities through the substrate is not particularly concerned, the base insulating layers may not be provided.

The base insulating layer may be formed by conducting treatment to the surface of the substrate 50 by high-density plasma. The high-density plasma is produced by using a microwave of 2.45 GHz, for example, and electron density is $10^{11}$ to $10^{13}/cm^3$, an electron temperature is 2 eV or less, and ion energy of 5 eV or less. Such high-density plasma has a low kinetic energy of activated species; therefore, a film having no damage by plasma and a few defects can be formed compared with conventional plasma treatment. The distance between an antenna generating a microwave and the substrate 50 may be set to be 20 mm to 80 mm, preferably 20 mm to 60 mm.

In addition, the surface of the substrate 50 can be nitrided by conducting the above-described high-density plasma treatment under a nitriding atmosphere, for example, under an atmosphere including nitrogen and a rare gas, an atmosphere including nitrogen, hydrogen, and a rare gas, or an atmosphere including ammonia and a rare gas. In a case of using a glass substrate, a quartz substrate, a silicon wafer, or the like as the substrate 50 and conducting nitriding treatment with the above-described high-density plasma, a nitride film formed over the surface of the substrate 50 contains silicon nitride as its main component; thus, the nitride film can be used as the first base insulating layer 51a. Silicon oxide or silicon oxynitride may be formed over the nitride layer by a plasma CVD method, which may be used as the second base insulating layer 51b.

In addition, by performing nitriding treatment with similar high-density plasma on the surface of the base insulating layer made of silicon oxide, silicon oxynitride, or the like, a nitride film can be formed over the surface. This nitride film can suppress diffusion of impurities from the substrate 50. In addition, the nitride film can be formed to be extremely thin. Therefore, the nitride film is preferable since it has little affect of stress on the semiconductor layer to be formed thereover.

In this embodiment mode, the semiconductor layer to be subsequently formed is obtained by crystallizing an amorphous silicon film by laser. The amorphous silicon film is formed over the second base insulating layer 51b to have a thickness of 25 to 100 nm (preferably, 30 to 60 nm). As a manufacturing method, a known method such as a sputtering method, a low pressure CVD method, or a plasma CVD method, can be used. Thereafter, heat treatment is conducted at 500° C. for one hour to perform dehydrogenation.

Subsequently, the amorphous silicon film is crystallized by using a laser irradiation apparatus to form a crystalline silicon film. In this embodiment mode, an excimer laser is used in laser crystallization. A laser beam oscillated from the laser irradiation apparatus is processed into a linear beam spot by using an optical system. The amorphous silicon film is irradiated with the linear beam spot to obtain a crystalline silicon film. The thus obtained crystalline silicon film is used as the semiconductor layer.

As other methods for crystallizing an amorphous silicon film, there are a method by which crystallization is performed only by heat treatment, and a method by which crystallization is performed by heat treatment with the use of a catalytic element promoting crystallization. As an element promoting crystallization, nickel, iron, palladium, tin, lead, cobalt, platinum, copper, gold, and the like are given. When such an element promoting crystallization is used, the crystallization is conducted at a lower temperature and a shorter time as compared to a case of conducting crystallization only by heat treatment. Therefore, the glass substrate and the like are less damaged by the crystallization. When crystallization is conducted only by heat treatment, a quartz substrate, which is resistant to heat, may be used as the substrate 50.

Subsequently, a minute amount of impurity is doped in the semiconductor layer in order to control a threshold value, which is a so-called channel doping, is performed, if necessary. To obtain a required threshold value, an impurity (such as phosphorus and boron) imparting an N-type conductivity or a P-type conductivity is added by an ion doping method or the like.

Thereafter, as shown in FIG. 2A, the semiconductor layer is patterned into a predetermined shape to obtain an island-like semiconductor layer 52. The patterning is conducted in such a way that a photoresist is applied over the semiconductor layer, a predetermined mask shape is exposed to light and baked to form a resist mask over the semiconductor layer, and the semiconductor layer is etched by utilizing the mask.

Subsequently, a gate insulating film 53 is formed so as to cover the semiconductor layer 52. The gate insulating film 53 is formed using an insulating layer containing silicon by a plasma CVD method or a sputtering method to have a thickness of 40 to 150 nm. In this embodiment mode, silicon oxide is used to form the gate insulating film 53. In this case, oxidizing or nitriding treatment is conducted by conducting treatment to the surface of the gate insulating film 53 to be dense by high-density plasma under an oxidizing atmosphere or a nitriding atmosphere, respectively.

It is to be noted that oxidizing or nitriding treatment may be conducted to the surface of the semiconductor layer by conducting high-density plasma treatment to the surface of the semiconductor layer 52 before the gate insulating film 53 is formed. At this time, by setting a temperature of the substrate 50 to be 300 to 450° C. and conducting treatment under an oxidizing atmosphere or a nitriding atmosphere, a favorable interface between the semiconductor layer 52 and the gate insulating film 53 which is formed thereover can be formed.

Next, a gate electrode 54 is formed over the gate insulating layer 53. The gate electrode 54 may be formed by using an element selected from tantalum, tungsten, titanium, molybdenum, aluminum, copper, chromium, and niobium; or an alloy material or a compound material containing these elements as its main component. Further, a semiconductor film typified by a polycrystalline silicon film doped with an impurity element such as phosphorus may be used. Furthermore, an AgPdCu alloy may be used.

In this embodiment mode, the gate electrode 54 is formed to have a single layer. Alternatively, the gate electrode 54 may have a laminated structure including two or more layers, for example, a lower layer made of tungsten and an upper layer made of molybdenum. In a case where the gate electrode is formed to have a laminated structure, the above-described materials may be used. Further, a combination of these materials may be arbitrarily selected. The gate electrode 54 is etched by utilizing a mask made of a photoresist.

Subsequently, a high concentration impurity is added into the semiconductor layer 52 while utilizing the gate electrode 54 as a mask. Thus, a thin film transistor 70 including the semiconductor layer 52, the gate insulating layer 53, and the gate electrode 54, is formed.

It is to be noted that a manufacturing process of the thin film transistor is not particularly limited, and may be arbitrarily changed so that a transistor having a desired structure can be manufactured.

In this embodiment mode, a top-gate thin film transistor using the crystalline silicon film, which is crystallized by laser crystallization, is used. Alternatively, a bottom-gate thin film transistor using an amorphous semiconductor film can be used for a pixel portion. The amorphous semiconductor can be formed by using not only silicon but also silicon germanium. In a case of using silicon germanium, the concentration of germanium is preferably set to be approximately 0.01 to 4.5 atomic %.

Further, a microcrystalline semiconductor film (semiamorphous semiconductor) in which 0.5 to 20 nm crystal grains can be observed in an amorphous semiconductor, may be used. In addition, fine crystals, in which 0.5 to 20 nm crystal grains can be observed, are also referred to as so-called microcrystals (μc).

Semiamorphous silicon (also referred to as SAS), which is a semiamorphous semiconductor, can be obtained by glow discharge decomposition of gas of a silicon compound. As typical gas, $SiH_4$ can be given, and in addition, $Si_2H_6$, $SiH_2Cl_2$, $SiHCl_3$, $SiCl_4$, $SiF_4$ and the like can be used. By diluting gas selected from these gases with hydrogen or a mixture of hydrogen and one or more rare gas elements selected from helium, argon, krypton, and neon, the SAS can be formed easily. The dilution ratio is preferably set to be in the range of 2 times and 1000 times. The reaction production of a coating film by glow discharge decomposition may be conducted at the pressure in the range of 0.1 and 133 Pa. The high-frequency power for forming glow discharge may be set to be 1 to 120 MHz, preferably 13 to 60 MHz. A substrate heating temperature may be set to be 300° C. or less, preferably 100 to 250° C.

Raman spectrum of the thus formed SAS is shifted toward a lower wavenumber side than 520 cm$^{-1}$. The diffraction peaks of (111) and (220), which are thought to be derived from Si crystal lattice, are observed by X-ray diffraction. Hydrogen or halogen of at least 1 atomic % or more is contained in order to terminate a dangling bond. With respect to impurity elements contained in the film, each impurity for atmospheric constituents such as oxygen, nitrogen, and carbon is preferably set to be $1\times10^{20}$ cm$^{-1}$ or less. In particular, the oxygen concentration is set to be $5\times10^{19}$/cm$^3$ or less, preferably $1\times10^{19}$/cm$^3$ or less. The mobility μ in a case of a TFT is 1 to 10 cm$^2$/Vsec.

In addition, the SAS may be further crystallized by laser.

Subsequently, an insulating film (hydrogenated film) 59 is formed by using silicon nitride so as to cover the gate electrode 54 and the gate insulating layer 53. The insulating film (hydrogenated film) 59 is heated at 480° C. for about 1 hour to activate the impurity element and hydrogenate the semiconductor layer 52. Hydrogenation of the insulating film (hydrogenated film) 59 may be conducted by introducing a hydrogen gas and conducting high-density plasma treatment after forming the insulating film (hydrogenated film) 59. According to this, the layer may be dense. In addition, thereafter, the semiconductor film 52 can be hydrogenated by conducting heat treatment at temperatures of 400 to 450° C. to release hydrogen.

Figure 2B:
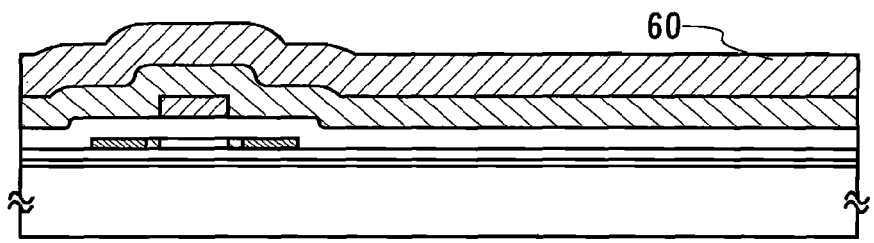

A first interlayer insulating layer 60 is formed so as to cover the insulating film (hydrogenated film) 59. As a material for forming the first interlayer insulating layer 60, silicon oxide, acrylic, polyimide, siloxane, a low-k material (low dielectric material), and the like may be used. In this embodiment mode, a silicon oxide film is formed as the first interlayer insulating layer (FIG. 2B).

Figure 2C:
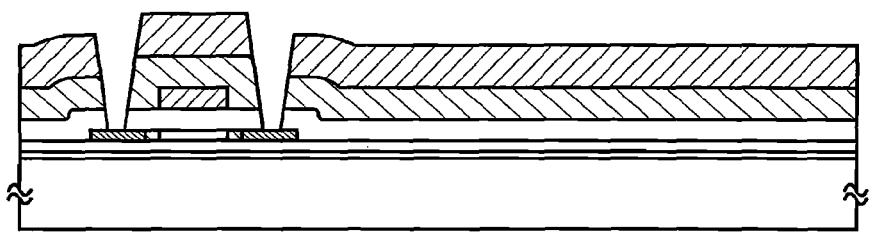

Next, a contact hole that reaches the semiconductor layer 52 is formed. The contact holes can be formed by etching to expose the semiconductor layer 52 by using a resist mask. The contact hole can be formed by either wet etching or dry etching. Further, the contact hole may be formed by etching one or more times depending on a condition. When etching is performed plural times, both wet etching and dry etching may be used (FIG. 2C).

Figure 2D:
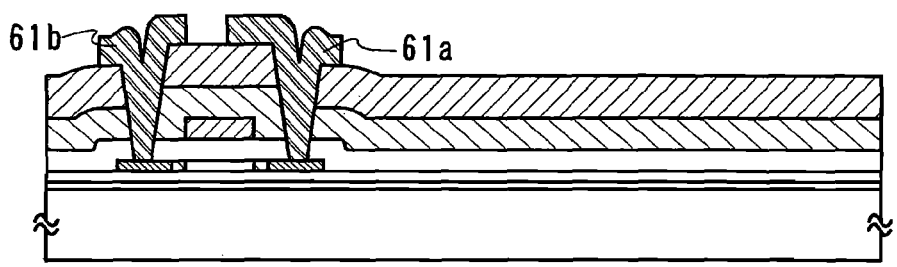

Then, a conductive layer is formed so as to cover the contact hole and the first interlayer insulating layer 60. This conductive layer is processed into a desired shape to form a connection portion 61a, a wiring 61b, and the like. This wiring may have a single layer made of aluminum; copper; alloy of aluminum, carbon, and nickel; an alloy of aluminum, carbon, and molybdenum; or the like. Further, the wiring may have a laminated structure of molybdenum, aluminum, and molybdenum; a laminated structure of titanium, aluminum, and titanium; or a laminated structure of titanium, titanium nitride, aluminum, and titanium, from the substrate side (FIG. 2D).

Figure 2E:
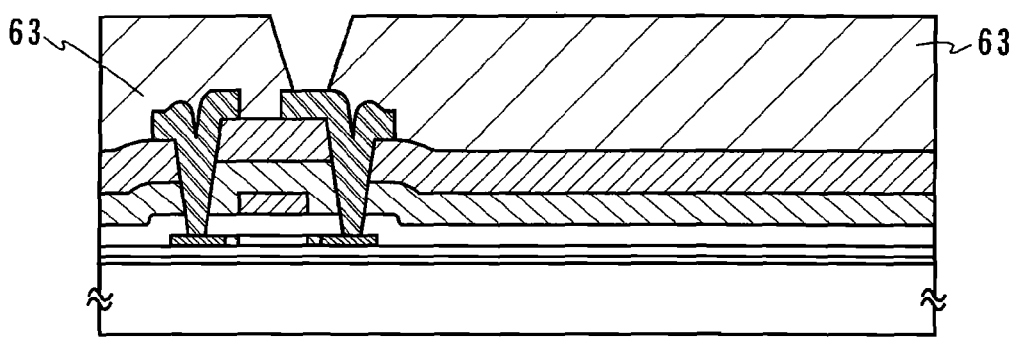

Thereafter, a second interlayer insulating layer 63 is formed so as to cover the connection portion 61a, the wiring 61b, and the first interlayer insulating layer 60. As a material for the second interlayer insulating layer 63, an application film having a self-planarizing property such as acrylic, polyimide, and siloxane is preferably used. In this embodiment mode, siloxane is used to form the second interlayer insulating layer 63 (FIG. 2E).

Subsequently, an insulating layer may be formed using silicon nitride or the like over the second interlayer insulating layer 63. This insulating layer is formed to prevent the second interlayer insulating layer 63 from being etched more than necessary in etching a pixel electrode afterward. Therefore, when a ratio of the etching rates between the pixel electrode and the second interlayer insulating layer is large, this insulating layer may not be provided. Next, a contact hole is formed through the second interlayer insulating layer 63 to reach the connection portion 61a.

Figure 3A:
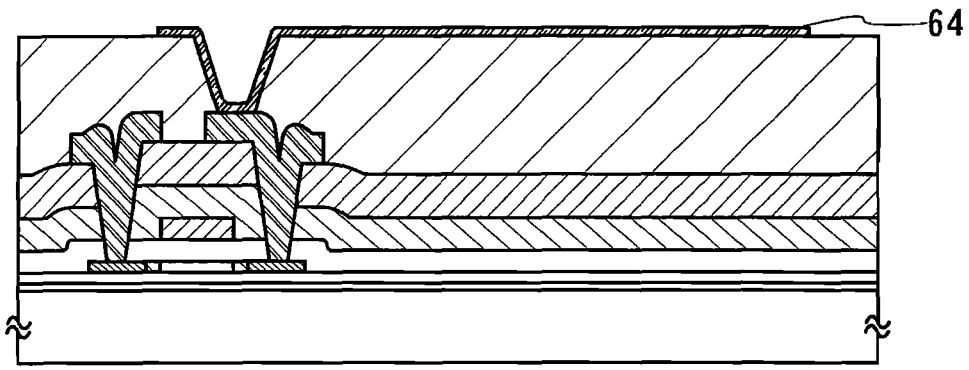
FIGS. 3A to 3C are cross-sectional frame formats each showing a manufacturing method of a light emitting device of the present invention.

A conductive layer having a light transmitting property is formed so as to cover the contact hole and the second interlayer insulating layer 63 (or the insulating layer). Thereafter, the conductive layer having the light transmitting property is processed to form a first electrode 64 of a thin film light emitting element. Here, the first electrode 64 is electrically in contact with the connection portion 61a. Refer to Embodiment Mode 1 for a material of the first electrode 64 (FIG. 3A).

Figure 3B:
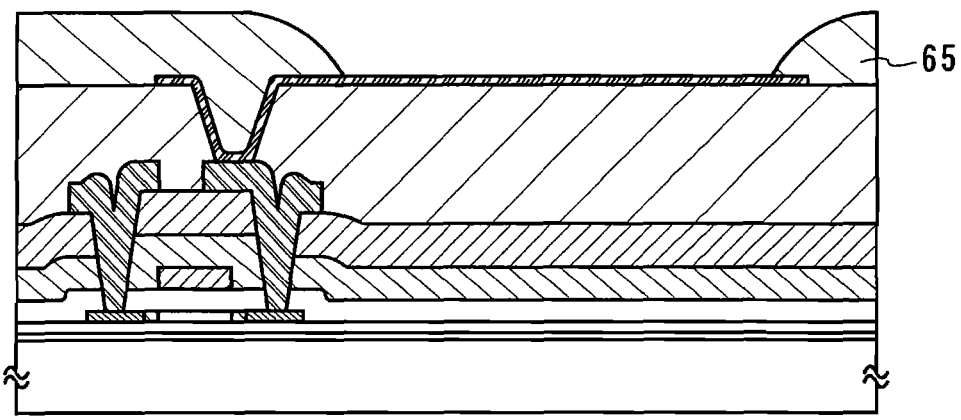

Next, an insulating layer is formed using an organic material or an inorganic material so as to cover the second interlayer insulating layer 63 (or the insulating layer) and the first electrode 64. Subsequently, the insulating layer is processed to expose part of the first electrode 64 so as to form a partition wall 65. A photosensitive organic material (such as acrylic and polyimide) is preferably used as a material of the partition wall 65. In addition, the partition wall may be formed using a nonphotosensitive organic or inorganic material. Further, a black pigment such as titanium black and carbon nitride or a dye may be dispersed in a material of the partition wall 65 by using a dispersant or the like to black the partition wall 65 so that the partition wall 65 may be used as a black matrix. Desirably, an edge of the partition wall 65, where faces the first electrode, has a tapered shape such that the curvature is continuously varied (FIG. 3B).

Figure 3C:
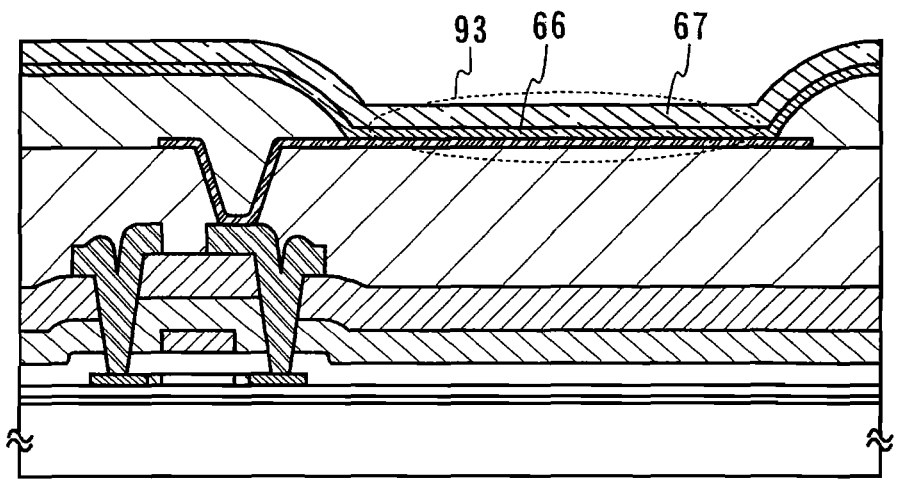

Then, a layer 66 including an organic compound is formed, and subsequently, a second electrode 67 covering the layer 66 including an organic compound is formed. According to this, a light emitting element 93 in which the layer 66 including an organic compound is interposed between the first electrode 64 and the second electrode 67 can be manufactured (FIG. 3C). The light emitting element in this embodiment mode has a structure shown in any of FIGS. 1A, 1C, and 1E in Embodiment Mode 1 because a light emitting device of the present invention in this embodiment mode has a structure in which light emission is extracted to a second electrode side.

Afterwards, a silicon oxide film containing nitrogen is formed as a passivation film by a plasma CVD method. In a case of using a silicon oxide film containing nitrogen, a silicon oxynitride film may be formed using $SiH_4$, $N_2O$, and $NH_3$ by a plasma CVD method, or a silicon oxynitride film may be formed using $SiH_4$ and $N_2O$ by a plasma CVD method, or a silicon oxynitride film may be formed using a gas in which $SiH_4$ and $N_2O$ are diluted with Ar, by a plasma CVD method.

Alternatively, as the passivation film, a hydrogenated silicon oxynitride film formed using $SiH_4$, $N_2O$, and $H_2$ may be used by a plasma CVD method. As a matter of course, the passivation film is not limited to a single layer structure, and it may have a single layer structure or a laminated structure of other insulating layer containing silicon. In addition, a multilayer film including a carbon nitride film and a silicon nitride film, a multilayer film including styrene polymer, a silicon nitride film, or a diamond like carbon film may be formed instead of the silicon oxide film containing nitrogen.

Figure 4:
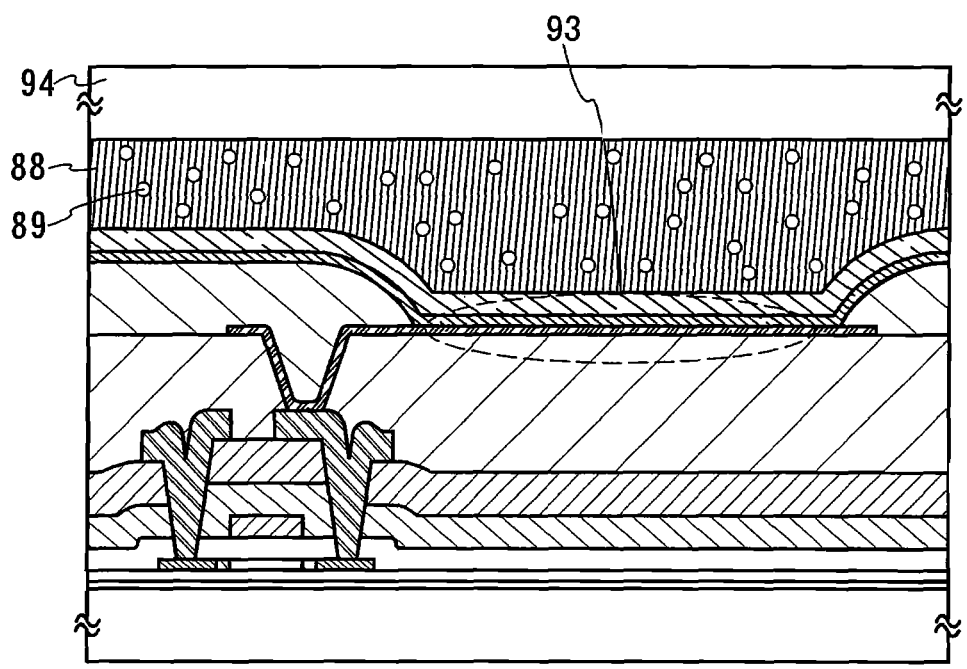
FIG. 4 is a cross-sectional frame format showing a manufacturing method of a light emitting device of the present invention.

Subsequently, to protect the light emitting element from a substance which promotes deterioration of the light emitting element such as water, a display portion is sealed. When the display portion is sealed with a counter substrate, the counter substrate is adhered with an insulating sealing material which is not shown such that an external connection portion is exposed. A space between the counter substrate and the element substrate may be filled with an inert gas such as dried nitrogen. Alternatively, a sealing material may be applied over the entire surface of the pixel portion and then the counter substrate may be attached thereto. An ultraviolet curable resin or the like is preferably used as the sealing material. A drying agent or a particle for maintaining a constant gap between the substrates may be mixed in the sealing material. Subsequently, a flexible wiring substrate is attached to the external connection portion, and accordingly, a light emitting device is completed (FIG. 4). In this embodiment mode, a space between a counter substrate 94 and the element is filled with a resin 88 or the like having a light transmitting property to be sealed. According to this, the light emitting element 93 can be prevented from being deteriorated by moisture. In addition, the resin 88 has desirably a hygroscopic property. Further, if a drying agent 89 having a high light transmitting property is dispersed into the resin 88, the affect of moisture can be suppressed, which is a further desirable mode.

The light emitting device according to the present invention with a display function may employ either analog video signals or digital video signals. When using the digital video signals, light emitting display devices are classified into one in which the video signals use voltage and one in which the video signals use current. When light emitting elements emit light, video signals inputted in pixels are classified into one at constant voltage and one at constant current. The video signals at constant voltage include one in which constant voltage is applied to a light emitting element and one in which constant current flows through a light emitting element. The video signals at constant current include one in which constant voltage is applied to a light emitting element and one in which constant current flows though a light emitting element.

The case where constant voltage is applied to a light emitting element indicates a constant voltage drive whereas the case where constant current flows though a light emitting element indicates a constant current drive. In the constant current drive, constant current flows regardless of the change in resistance of a light emitting element. Furthermore, any of driving methods described above may be used for the light emitting device of the present invention and a method for driving the light emitting element.

The light emitting device of the present invention having the structure described above is a light emitting device which can easily achieve low power consumption and the improvement of color purity at the same time without appearance of an adverse effect such as reduction in voltage and luminance efficiency.

This embodiment mode can be implemented by being freely combined with any of the above described appropriate embodiment modes.

Embodiment Mode 3

Figure 5A:
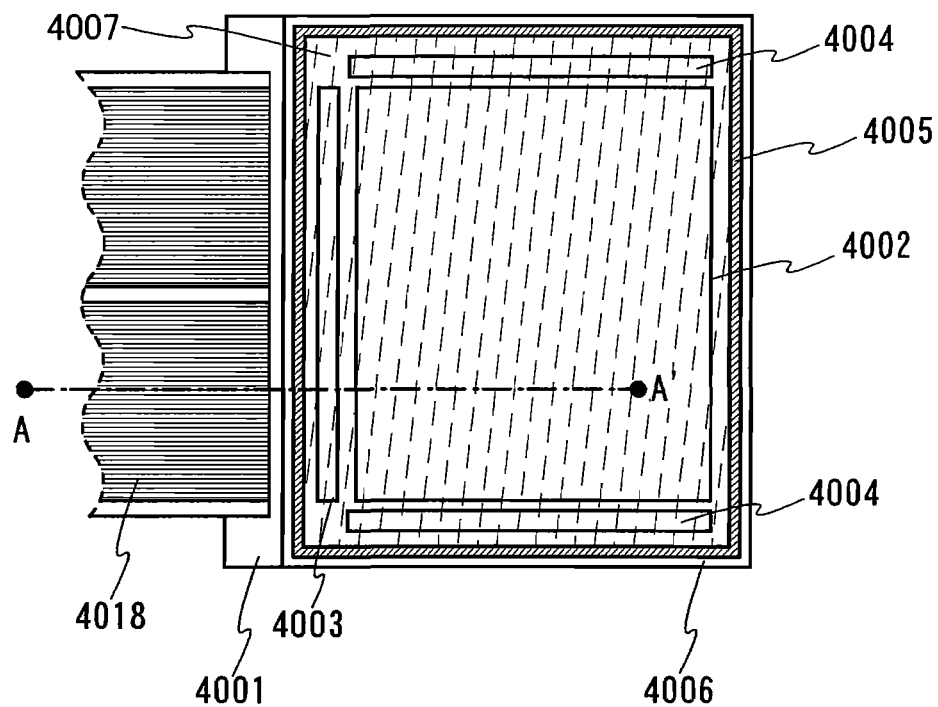
FIG. 5A is a top frame format and FIG. 5B is a cross-sectional frame format of a light emitting device of the present invention.
Figure 5B:
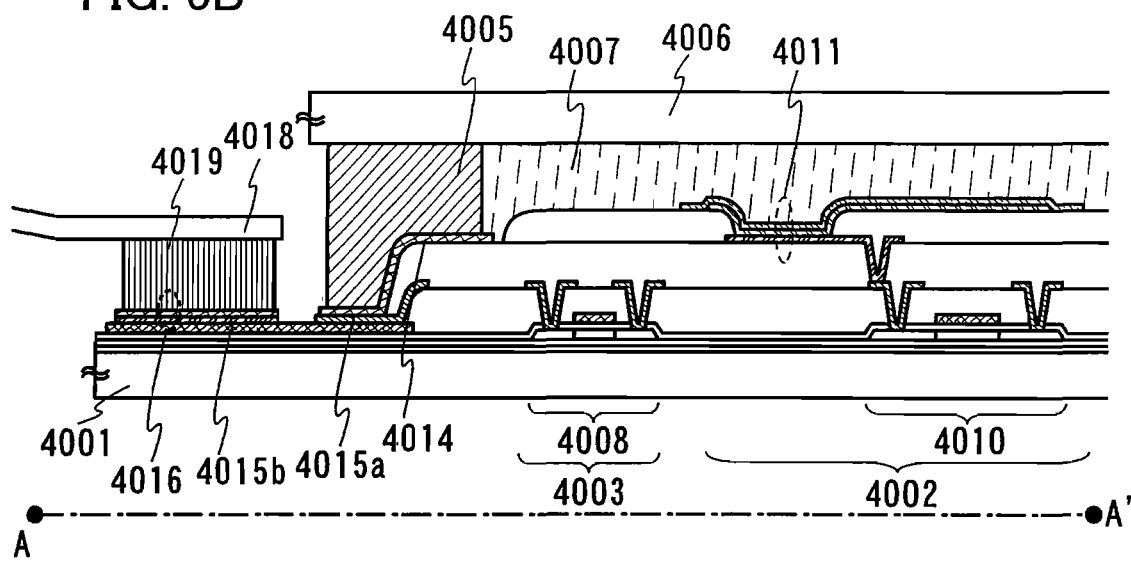

In this embodiment mode, an outer appearance of a panel of an active matrix light emitting device, which is a display device of the present invention, will be described with reference to FIGS. 5A and 5B. FIG. 5A is a top view of a panel in which a transistor and a light emitting element formed over a substrate are sealed with a sealing material that is formed between the substrate and a counter substrate 4006. FIG. 5B is a cross-sectional view of FIG. 5A. The light emitting element of this panel has a structure as shown in Embodiment Mode 1.

A sealing material 4005 is provided so as to surround a pixel portion 4002, a signal line driver circuit 4003, and a scanning line driver circuit 4004 that are provided over a substrate 4001. The counter substrate 4006 is provided over the pixel portion 4002, the signal line driver circuit 4003, and the scanning line driver circuit 4004. Thus, the pixel portion 4002, the signal line driver circuit 4003, and the scanning line driver circuit 4004 are hermetically sealed with the substrate 4001, the sealing material 4005, and the counter substrate 4006 along with a filler 4007.

The pixel portion 4002, the signal line driver circuit 4003, and the scanning line driver circuit 4004, which are provided over the substrate 4001, have a plurality of thin film transistors. In FIG. 5B, a thin film transistor 4008 included in the signal line driver circuit 4003 and a thin film transistor 4010 included in the pixel portion 4002 are shown.

Further, a light emitting device 4011 is electrically connected to the thin film transistor 4010.

Also, a leading wiring 4014 corresponds to a wiring for supplying signals or power supply voltage to the pixel portion 4002, the signal line driver circuit 4003, and the scanning line driver circuit 4004. The leading wiring 4014 is connected to a connection terminal 4016 through leading wirings 4015*a* and 4015*b*. The connection terminal 4016 is electrically connected to a terminal included in a flexible printed circuit (FPC) 4018 through an anisotropic conductive film 4019.

Further, as the filler 4007, an ultraviolet curing resin or a heat curing resin can be used in addition to an inert gas such as nitrogen and argon. For example, polyvinyl chloride, acrylic, polyimide, an epoxy resin, a silicon resin, polyvinyl butyral, or ethylene vinylene acetate can be used.

Furthermore, the light emitting device of the present invention includes a panel in which a pixel portion having a light emitting device is formed and a module in which an IC is mounted on the panel.

The light emitting element of the present invention having the structure described above is a light emitting device which can easily achieve low power consumption and the improvement of color purity at the same time without appearance of an adverse effect such as reduction in voltage and luminance efficiency.

This embodiment mode can be implemented by being freely combined with any of the above described appropriate embodiment modes.

Embodiment Mode 4

In this embodiment mode, pixel circuits and protection circuits included in the panel and module described in Embodiment Mode 3, and operations thereof will be explained. Further, the cross sectional views shown in Embodiment Mode 3 correspond to cross-sectional views of a driving TFT 1403 and a light emitting element 1405.

Figure 6A:
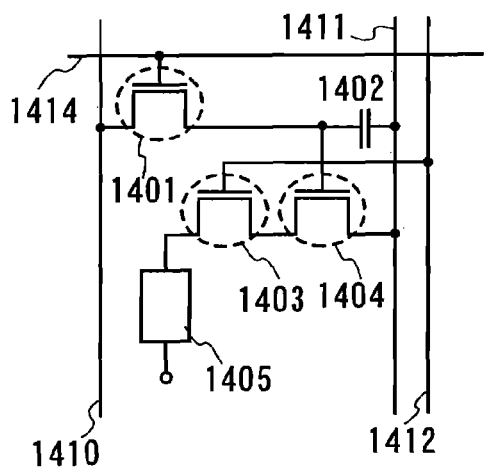
FIGS. 6A to 6F are circuit diagrams each showing one example of a pixel circuit.

In a pixel shown in FIG. 6A, a signal line 1410, power supply lines 1411 and 1412 are arranged in a column direction, whereas a scanning line 1414 is arranged in a row direction. The pixel also includes a switching TFT 1401, a driving TFT 1403, a current controlling TFT 1404, a capacitor element 1402, and a light emitting element 1405.

Figure 6B:
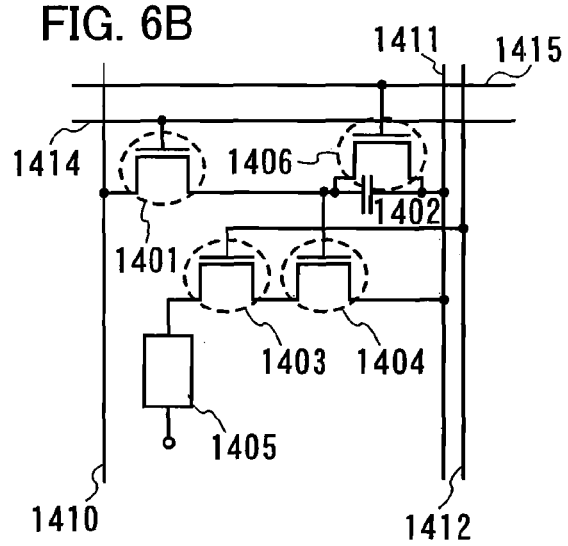
Figure 6C:
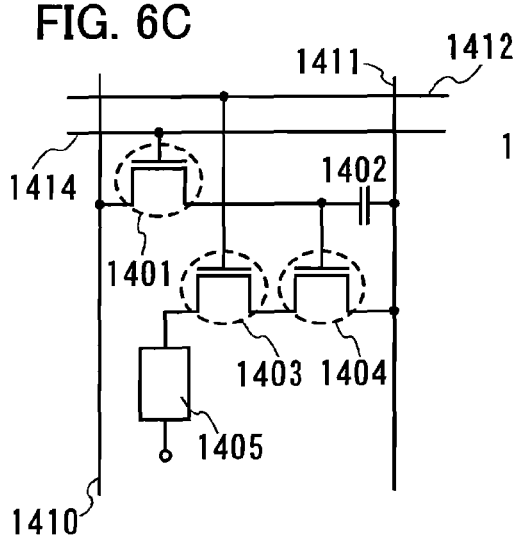
Figure 6D:
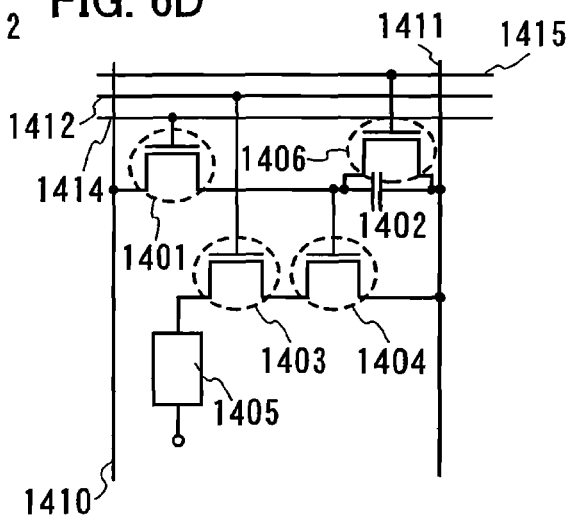

A pixel shown in FIG. 6C has a similar structure to the pixel shown in FIG. 6A, except that a gate electrode of the driving TFT 1403 is connected to a power supply line 1412 that is arranged in a row direction. That is, the equivalents circuit of each pixel shown in FIGS. 6A and 6C are the same. However, respective power supply lines are made of conductive films in different layers between the case where the power supply line 1412 is arranged in a column direction (FIG. 6A) and the case where the power supply line 1412 is arranged in a row direction (FIG. 6C). In order to emphasis on the different arrangement of a wiring to which the gate electrode of the driving TFT 1403 is connected, the equivalent circuit diagrams are individually illustrated in FIGS. 6A and 6C.

In each pixel shown in FIGS. 6A and 6C, the driving TFT 1403 and the current controlling TFT 1404 are connected in series, and the channel length 41403) and the channel width W(1403) of the driving TFT 1403 and the channel length 41404) and the channel width W(1404) of the current controlling TFT 1404 may be set to satisfy the relation of L(1403)/W(1403):L(1404)/W(1404)=5 to 6,000:1.

The driving TFT 1403 is operated in a saturation region and controls the amount of current flowing through the light emitting element 1405, whereas the current controlling TFT 1404 is operated in a linear region and controls current supplied to the light emitting element 1405. The both TFTs 1403 and 1404 preferably have the same conductivity type in view of the manufacturing process, and n-channel TFTs are formed as the TFTs 1403 and 1404 in this embodiment mode. Also, a depletion type TFT may be used as the driving TFT 1403 instead of an enhancement type TFT. In a light emitting device of the present invention having the above structure, slight variations in Vgs of the current controlling TFT 1404 does not adversely affect the amount of current flowing through the light emitting element 1405, since the current controlling TFT 1404 is operated in the linear region. That is, the amount of current flowing through the light emitting element 1405 can be determined by the driving TFT 1403 operated in the saturation region. In accordance with the above described structure, it is possible to provide a light emitting device in which image quality is improved by improving variations in luminance of a light emitting element due to variation of the TFT characteristics.

The switching TFT 1401 of each pixel shown in FIGS. 6A to 6D controls a video signal input with respect to the pixel. When the switching TFT 1401 is turned on and a video signal is inputted in the pixel, a voltage of the video signal is held in the capacitor element 1402. Although the arrangement in which each pixel includes the capacitor element 1402 is shown in FIGS. 6A and 6C, the present invention is not limited thereto. When a gate capacitor or the like can function as a capacitor for holding a video signal, the capacitor element 1402 may not be provided.

A pixel shown in FIG. 6B has a similar structure to the pixel structure shown in FIG. 6A, except that a TFT 1406 and a scanning line 1414 are added thereto. Similarly, a pixel shown in FIG. 6D has a similar structure to the pixel structure shown in FIG. 6C, except that a TFT 1406 and a scanning line 1414 are added thereto.

The TFT 1406 is controlled to be turned on/off by the newly provided scanning line 1414. When the TFT 1406 is turned on, the charge held in the capacitor element 1402 is discharged, thereby turning the current controlling TFT 1404 off. That is, supply of current flowing through the light emitting element 1405 can be forcibly stopped by providing the TFT 1406. Therefore, the TFT 1406 can be referred to as an erasing TFT. In accordance with the structures shown in FIGS. 6B and 6D, a lighting period can start simultaneously with or immediately after a writing period starts before signals are written into all the pixels, and hence, the duty ratio can be improved.

Figure 6E:
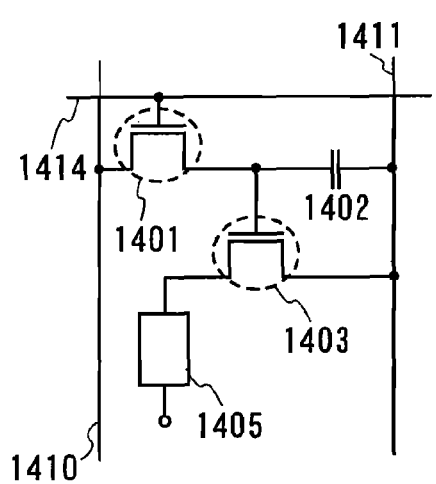
Figure 6F:
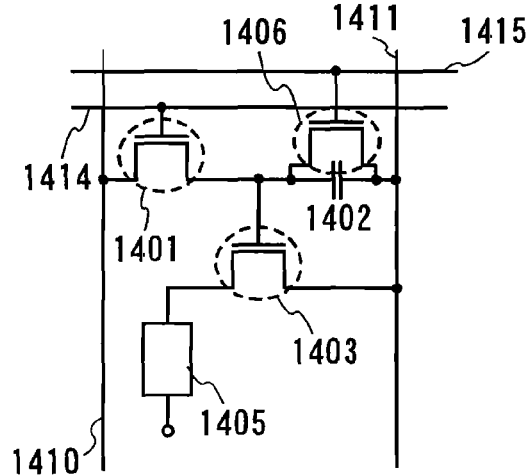

In a pixel as shown in FIG. 6E, a signal line 1410 and a power supply line 1411 are arranged in a column direction while a scanning line 1414 is arranged in a row direction. The pixel further includes a switching TFT 1401, a driving TFT 1403, a capacitor element 1402, and a light emitting element 1405. A pixel shown in FIG. 6F has a structure to the pixel structure shown in FIG. 6E, except that a TFT 1406 and a scanning line 1415 are added thereto. Further, the structure as shown in FIG. 6F also allows a duty ratio to be improved by providing the TFT 1406.

Figure 7:
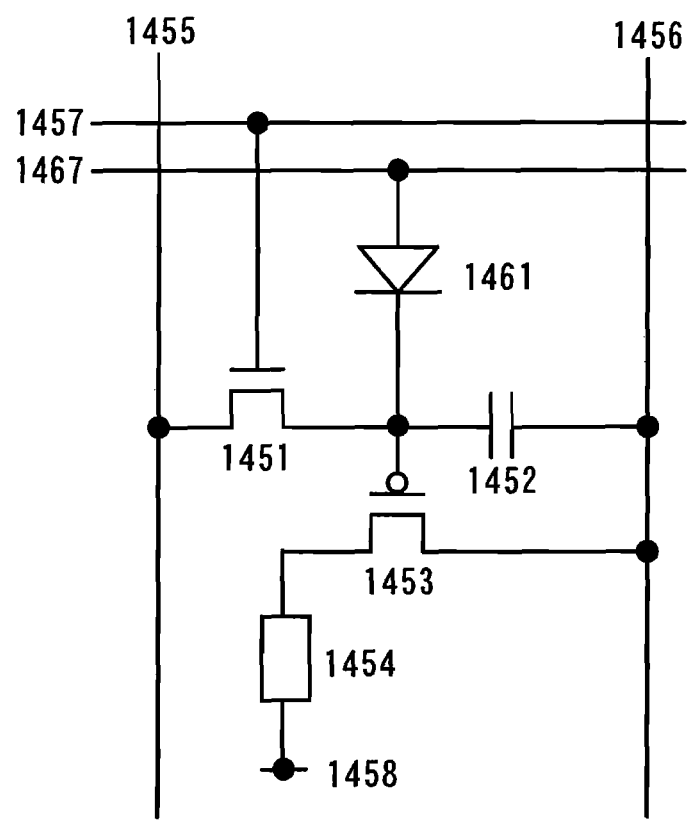
FIG. 7 is a circuit diagram showing one example of a pixel circuit.

A structural example of a pixel in a case where the driving TFT 1403 is forcibly turned off will be shown in FIG. 7. In FIG. 7, a selecting TFT 1451, a driving TFT 1453, an erasing diode 1461, and a light emitting element 1454 are arranged. A source and a drain of the selecting TFT 1451 are connected to a signal line 1455 and a gate of the driving TFT 1453, respectively. A gate of the selecting TFT 1451 is connected to a first gate line 1457. A source and a drain of the driving TFT 1453 are connected to a first power supply line 1456 and the light emitting element 1454, respectively. The erasing diode 1461 is connected to a gate of the driving TFT 1453 and a second gate line 1467.

A capacitor element 1452 functions to hold gate potential of the driving TFT 1453. Therefore, the capacitor element 1452 is connected between the gate of the driving TFT 1453 and the power supply line 1456. However, the present invention is not limited to this structure, and the capacitor element may be arranged such that it can hold gate potential of the driving TFT 1453. Further, when gate potential of the driving TFT 1453 can be held by using a gate capacitor of the driving TFT 1453, the capacitor element 1452 may be eliminated.

As the driving method, the first gate line 1457 is selected and the selecting TFT 1451 is turned on. When a signal is inputted in the capacitor element 1452 from the signal line 1455, current of the driving TFT 1453 is controlled in accordance with the signal, and current flows into a second power supply line 1458 through the light emitting element 1454 from the first power supply line 1456.

In order to erase a signal, the second gate line 1467 is selected (in this case, potential of the second gate line is increased), and the erasing diode 1461 is turned on so as to feed current to the gate of the driving TFT 1453 from the second gate line 1467. As a result, the driving TFT 1453 becomes an off state. Thus, current does not flow into the second power supply line 1458 from the first power supply line 1456 through the light emitting element 1454. Consequently, a non-light emitting period can be made, thereby freely adjusting the length of a light emitting period.

In order to hold a signal, the second gate line 1467 is not selected (in this case, potential of the second gate line is reduced). Thus, the erasing diode 1461 is turned off so that gate potential of the driving TFT 1453 is held.

Further, the erasing diode 1461 is not particularly limited as long as it is an element having a rectifying property. Either a PN-type diode or a PIN-type diode may be used. Alternatively, either a Schottky diode or a zener diode may be used.

As described above, various kinds of pixel circuits can be employed. In particular, when a thin film transistor is formed using an amorphous semiconductor film, an area of a semiconductor film of each of the driving TFTs 1403 and 1453 is preferably made large. Therefore, in the above pixel circuits, a top emission type in which light generated in the light emitting body is emitted through a counter substrate, is preferably employed.

It is thought that such an active matrix light emitting device is preferable when pixel density is increased since a TFT is provided for each pixel and driving with a low drive voltage can be conducted.

An active matrix light emitting device in which a TFT is provided in each pixel is described in this embodiment mode. However, a passive matrix light emitting device in which a TFT is provided for each column can be formed. Since a TFT is not provided in each pixel in the passive matrix light emitting device, high aperture ratio is obtained. In the case of a light emitting device in which light generated in a light emitting body is emitted toward both sides of the light emitting body, when a passive matrix light emitting device is employed, transmittance can be increased.

Subsequently, a case in which diodes are provided as protection circuits in a scanning line and a signal line, will be described using an equivalent circuit diagram shown in FIG. 6E.

Figure 8:
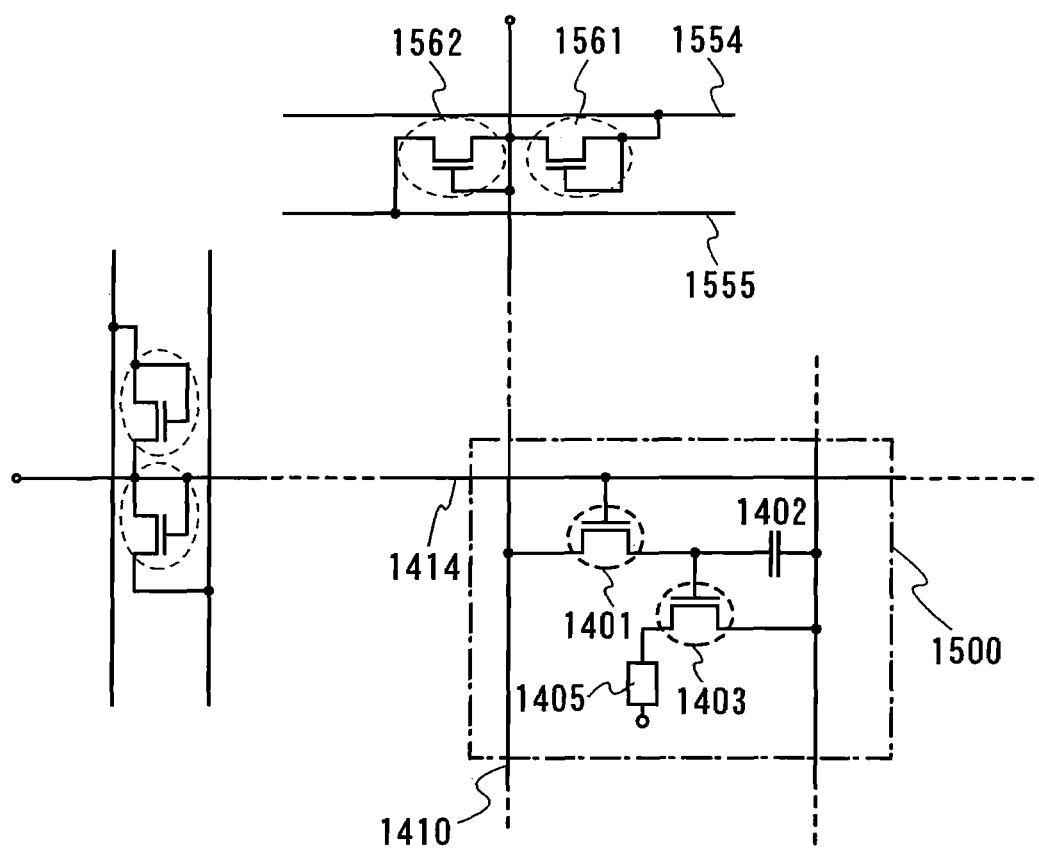
FIG. 8 is a circuit diagram showing one example of a protection circuit.

In FIG. 8, switching TFTs 1401 and 1403, a capacitor element 1402, and a light emitting element 1405 are provided in a pixel portion 1500. In the signal line 1410, diodes 1561 and 1562 are provided. The diodes 1561 and 1562 are manufactured in accordance with the above described embodiment mode in the same manner as the switching TFTs 1401 and 1403. Each diode includes a gate electrode, a semiconductor layer, a source electrode, a drain electrode, and the like. By connecting the gate electrode to the drain electrode or the source electrode, the diodes 1561 and 1562 are operated.

Common potential lines 1554 and 1555 connecting to the diodes are formed in the same layer as the gate electrodes. Therefore, it is necessary to form contact holes in a gate insulating layer so as to be connected to the source electrodes or the drain electrodes of the diodes.

A diode provided in the scanning line 1414 has the similar structure.

As mentioned above, protection diodes can be simultaneously formed in an input stage according to the present invention. Further, the positions of the protection diodes are not limited to this, and they can be provided between a driver circuit and a pixel.

The light emitting element of the present invention having such a protection circuit is a light emitting device which can easily achieve low power consumption and the improvement of color purity at the same time without appearance of an adverse effect such as reduction in voltage and luminance efficiency. Further, the reliability of the light emitting device can be further improved by the above-described structure.

Embodiment Mode 5

As an electronic device mounted with a light emitting device (module) of the present invention, a camera such as a video camera and a digital camera; a goggle type display (head mounted display); a navigation system; an audio reproducing device (car audio component or the like); a computer; a game machine; a portable information terminal (e.g., a mobile computer, a mobile phone, a portable game machine, an electronic book, and the like); an image reproducing device equipped with a recording medium (concretely, a device having a display that can reproduce a recording medium such as a digital versatile disc (DVD) and can display an image thereof); and the like are given. Specific examples of these electronic devices are shown in FIGS. 9A to 9E.

Figure 9A:
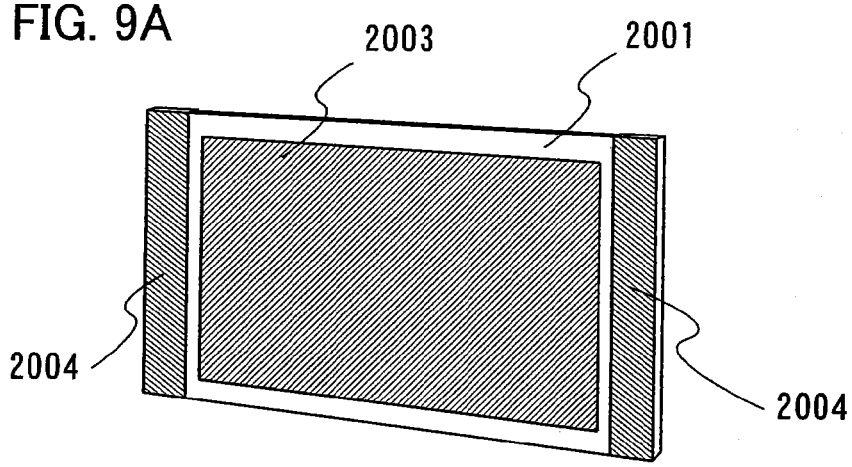
FIGS. 9A to 9E are frame formats each showing an electronic device of the present invention.

FIG. 9A shows a light emitting device, which corresponds to a monitor for a television receiver, a personal computer, or the like, including a housing 2001, a display portion 2003, speaker portions 2004, and the like. The light emitting device of the present invention is a light emitting device with high display quality which consumes low power. A pixel portion may be provided with a polarizing plate or a circularly polarizing plate to enhance contrast. For example, a ¼ λ plate, a ½ λ plate, and a polarizing plate may be provided to a counter substrate in this order. Further, an anti-reflective film may be provided.

Figure 9B:
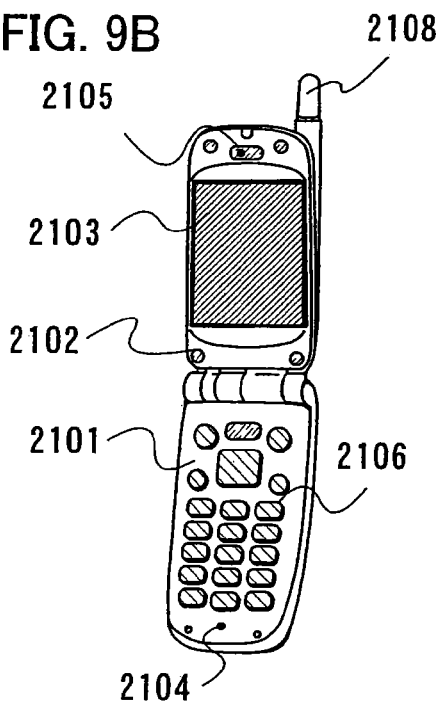

FIG. 9B shows a mobile phone, including a main body 2101, a housing 2102, a display portion 2103, an audio input portion 2104, an audio output portion 2105, operation keys 2106, an antenna 2108, and the like. The mobile phone of the present invention is a mobile phone with high display quality which consumes low power.

Figure 9C:
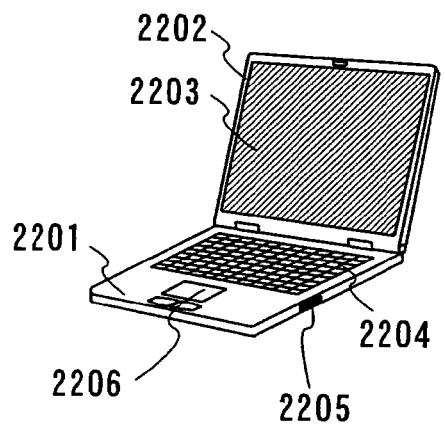

FIG. 9C shows a computer, including a main body 2201, a housing 2202, a display portion 2203, a keyboard 2204, an external connection port 2205, a pointing mouse 2206, and the like. The computer of the present invention is a computer with high display quality which consumes low power. Although a laptop computer is illustrated in FIG. 9C, the present invention can be applied to a desktop computer in which a hard disk and a display portion are incorporated in one housing, or the like.

Figure 9D:
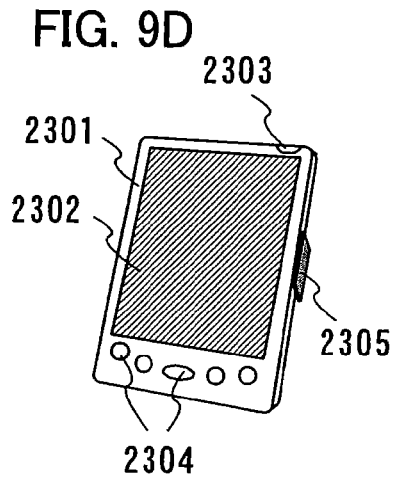

FIG. 9D shows a mobile computer, including a main body 2301, a display portion 2302, a switch 2303, operation keys 2304, an infrared port 2305, and the like. The mobile computer of the present invention is a mobile computer with high display quality which consumes low power.

Figure 9E:
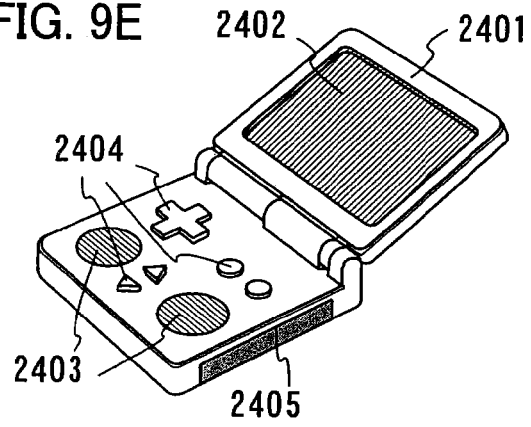

FIG. 9E shows a portable game machine, including a housing 2401, a display portion 2402, speaker portions 2403, operation keys 2404, a recording medium insert portion 2405, and the like. The portable game machine of the present invention is a portable game machine with high display quality which consumes low power.

As described above, the application range of the present invention is extremely wide and can be used for electronic devices in various fields.

This embodiment mode can be implemented by being freely combined with any of the above described appropriate embodiment modes.

Embodiment Mode 6

In this embodiment mode, a mode in which a thickness of a buffer layer is changed in accordance with luminescent color of a light emitting layer will be explained with reference to FIGS. 10A and 10B.

Figure 10A:
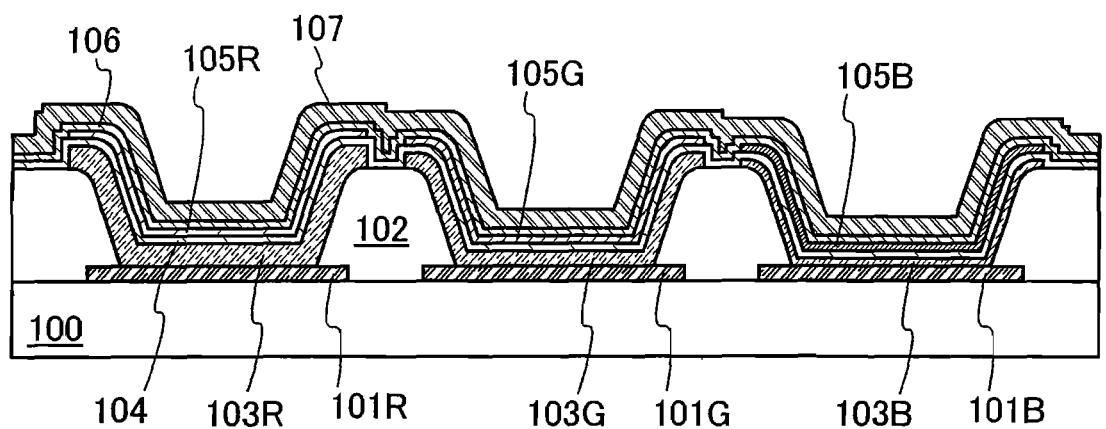
FIGS. 10A and 10B are cross-sectional frame formats of a light emitting device of the present invention.

FIG. 10A is a cross-sectional view in part of a light emitting device of the present invention. Three light emitting elements, which are shown, are a light emitting element which emits red light emission, a light emitting element which emits green light emission, and a light emitting element which emits blue light emission, respectively. The light emitting element which emits red light emission includes a first electrode 101R, a buffer layer 103R, a common hole transporting layer 104, a light emitting layer 105R, a common electron transporting layer 106, and a common second electrode 107 over an insulator 100 corresponding to a substrate or an interlayer insulating film. The light emitting element which emits green light emission includes a first electrode 101G, a buffer layer 103G, the common hole transporting layer 104, a light emitting layer 105G, the common electron transporting layer 106, and the common second electrode 107 over the insulator 100 corresponding to a substrate or an interlayer insulating film. The light emitting element which emits blue light emission includes a first electrode 101B, a buffer layer 103B, the common hole transporting layer 104, a light emitting layer 105B, the common electron transporting layer 106, and the common second electrode 107 over the insulator 100 corresponding to a substrate or an interlayer insulating film. The edge portions of the first electrodes 101R, 101G, and 101B in each light emitting element are covered with a partition wall 102, and accordingly, the elements are insulated from each other. The thicknesses of the buffer layers 103R, 103G, and 103B are set in accordance with a maximum wavelength of light extracted from each light emitting element.

FIG. 10A shows an example of a structure in which a layer except for the first electrode, the buffer layer, and the light emitting layer is common to the light emitting elements of each color. FIG. 10A shows an example of using only the hole transporting layer 104 and the electron transporting layer 106. However, as a matter of course, a layer having other function may be provided, and the hole transporting layer 104 and the electron transporting layer 106 may not be provided.

Figure 10B:
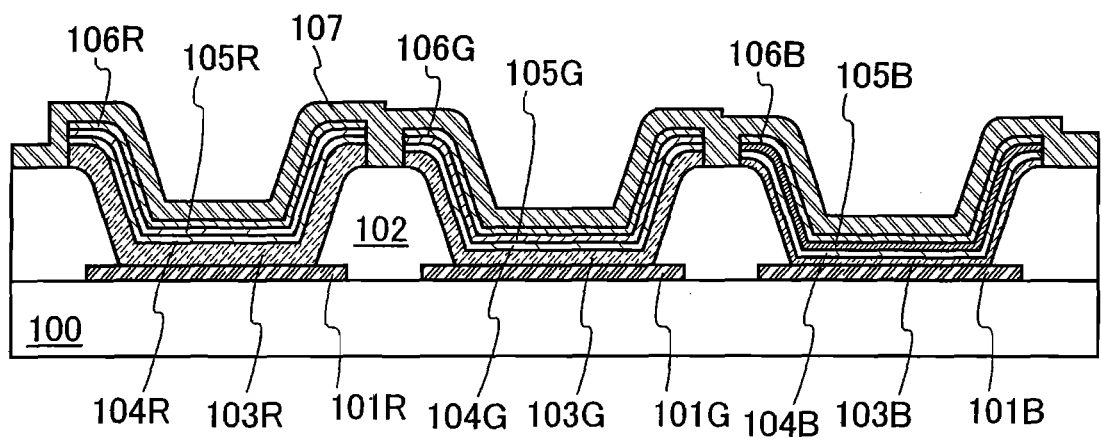

FIG. 10B shows a structure in which a layer except for a second electrode is separated in each light emitting element. In other words, the light emitting element which emits red light emission includes a first electrode 101R, a buffer layer 103R, a hole transporting layer 104R, a light emitting layer 105R, an electron transporting layer 106R, and a common second electrode 107 over an insulator 100 corresponding to a substrate or an interlayer insulating film. The light emitting element which emits green light emission includes a first electrode 101G a buffer layer 103G, a hole transporting layer 104G a light emitting layer 105G, an electron transporting layer 106G, and the common second electrode 107 over the insulator 100 corresponding to a substrate or an interlayer insulating film. The light emitting element which emits blue light emission includes a first electrode 101B, a buffer layer 103B, a hole transporting layer 104B, a light emitting layer 105B, an electron transporting layer 106B, and the common second electrode 107 over the insulator 100 corresponding to a substrate or an interlayer insulating film. The edge portions of the first electrodes 101R, 101G, and 101B in each light emitting element are covered with a partition wall 102, and accordingly, the elements are insulated from each other. The thicknesses of the buffer layers 103R, 103G, and 103B are set in accordance with a maximum wavelength of light extracted from each light emitting element.

FIG. 10B shows an example of using only the hole transporting layer and the electron transporting layer. However, as a matter of course, a layer having other function may be provided, and the hole transporting layer and the electron transporting layer may not be provided. In addition, a material for a functional layer such as a hole transporting layer and an electron transporting layer may be different or the same in each light emitting element.

Each functional layer provided to each light emitting element may have a structure in which a functional layer is separated between the light emitting elements or may have a structure in which the functional layer is not separated and thus common to all of the light emitting elements. Each functional layer to be provided may be different in each light emitting element.

The light emitting element of the present invention having the structure described above is a light emitting device which can easily achieve low power consumption and the improvement of color purity at the same time without appearance of an adverse effect such as reduction in voltage and luminance efficiency.

In addition, a thickness of the buffer layer can be optimized with respect to a wavelength of luminescent color by being changed in each luminescent color of the light emitting element; therefore, further improvement of color purity or low power consumption can be achieved.

Embodiment 1

A light emitting element having a structure shown in FIG. 1F was manufactured over a glass substrate, and characteristics thereof were measured. In this embodiment, a light emitting element which is manufactured is referred to as "light emitting element 1". First, a structure of the light emitting element 1 and a manufacturing method thereof will be explained.

<First Electrode 400 (Translucent Electrode)>

As the first electrode 400 (translucent electrode), ITO containing silicon (hereinafter, referred to as "ITSO") having a thickness of 110 nm was formed over a glass substrate by a sputtering apparatus. Ag having a thickness of 15 nm was evaporated over ITSO. By forming ITSO and Ag which is extremely thin to be laminated, a translucent electrode having reflectivity could be formed.

<Buffer Layer 401>

As the buffer layer 401, a composite material of 4,4'-bis{N-[4-(N,N-di-m-tolylamino)phenyl]-N-phenylamino}biphenyl (hereinafter, referred to as "DNTPD") and molybdenum oxide was formed to have a thickness of 125 nm over Ag. DNTPD is an organic compound showing a hole transporting property. The composite material was formed by co-evaporation of DNTPD and molybdenum oxide, and $MoO_3$ was used for an evaporation source of molybdenum oxide (hereinafter, referred to as "MoOx"). A mass ratio was set to be DNTPD:MoOx=4:2.

<Light Emitting Laminated Body 402>

A light emitting laminated body 402 was formed to have four functional layers. First, 4,4'-bis[N-(1-naphthyl)-N-phenylamino]biphenyl (hereinafter, referred to as "NPB") was formed to have a thickness of 10 nm over the composite material of DNTPD and MoOx. Coumarin 6 and tris(8-quinolinolato)aluminum (hereinafter, referred to as "$Alq_3$") was co-evaporated over NPB to form a composite material having a thickness of 40 nm. A mass ratio was set to be coumarin 6:$Alq_3$=1:0.01. A composite material layer of coumarin 6 and $Alq_3$ functions as a light emitting layer. $Alq_3$ was evaporated to have a thickness of 30 nm over the composite material of coumarin 6 and $Alq_3$. LiF was evaporated over $Alq_3$ to have a thickness of 1 nm.

<Second Electrode 403 (Reflective Electrode)>

As the second electrode 403, Al was formed to have a thickness of 200 nm over the LiF by a sputtering apparatus. Al functions as a reflective electrode.

In the light emitting element 1, an optical design was conducted so that light with a wavelength of 515 nm is resonated. The thickness of the buffer layer 401 was determined so as to optimize a distance between the first electrode 400 and the second electrode 403. The physical distance between the first electrode 400 and the second electrode 403 is 206 nm.

<Comparative Element>

In this embodiment, a light emitting element for comparison (hereinafter, referred to as "comparative element") was manufactured to evaluate characteristics of the light emitting element 1. The comparative element is an element in which a first electrode 400 is a transparent electrode, not a translucent electrode. The difference between the light emitting element 1 and the comparative element is that the first electrode 400 is formed to have a single layer of ITSO having a thickness of 110 nm without providing Ag. Except for the difference, the comparative element was manufactured under the condition which is the same as the light emitting element 1. Table 1 shows a material and a thickness of each layer included in the light emitting element 1 and the comparative element.

TABLE 1

|  | light emitting element 1 | comparative element |
| --- | --- | --- |
| second electrode 403 | Al (200 nm) | |
| light emitting laminated body 402 | LiF (1 nm) | |
| | Alq3 (30 nm) | |
| | Alq3 + coumarin6 (mass ratio = 1:0.01) (40 nm) | |
| | NPB (10 nm) | |
| buffer layer 401 | DNTPD + MoOx (mass ratio = 4:2) (125 nm) | |
| First electrode 400 | Ag (15 nm) | ITSO (110 nm) |
| | ITSO (110 nm) | |

Figure 11A:
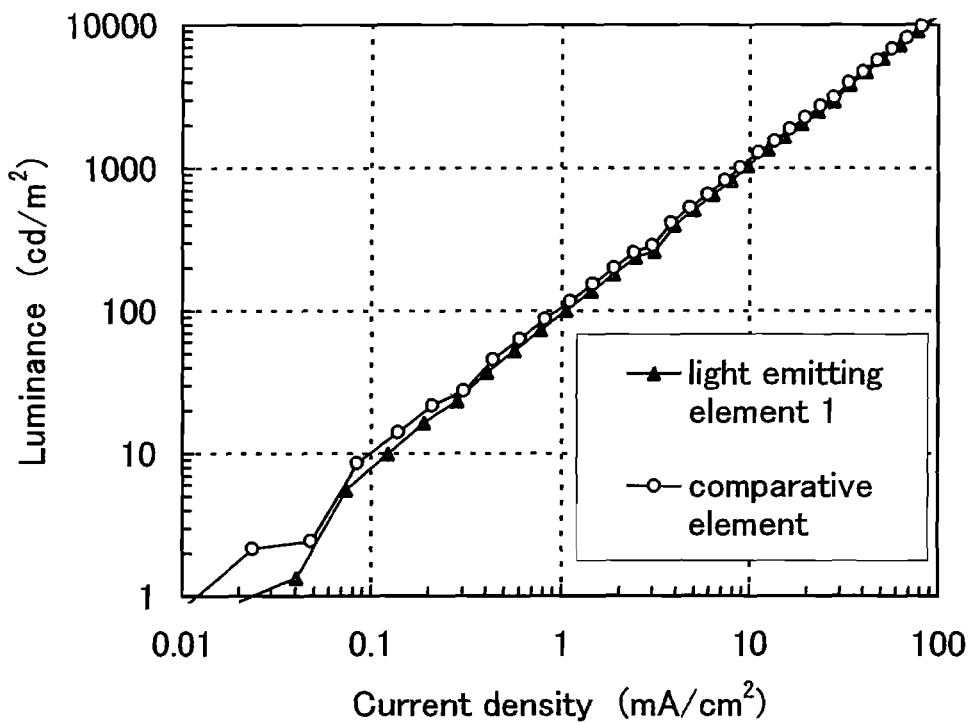
FIGS. 11A and 11B are a current density-luminance characteristics drawing and a voltage-luminance characteristics drawing of a light emitting element 1 and a comparative element (Embodiment 1)
Figure 11B:
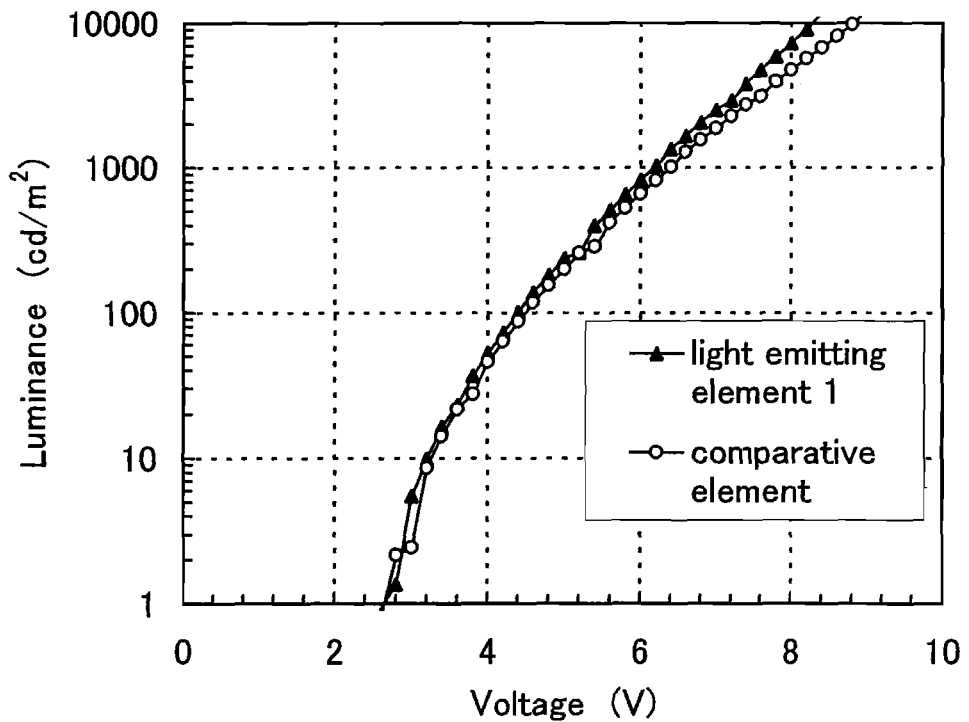

FIG. 11A shows current density-luminance characteristics and FIG. 11B shows voltage-luminance characteristics of the light emitting element 1 and the comparative element. As shown in FIGS. 11A and 11B, it was revealed that the light emitting element 1 and the comparative element show almost the same characteristics. Current efficiency at luminance of 3000 cd/m$^2$ is 10.6 cd/A in the light emitting element 1 and 11.3 cd/A in the comparative element.

On the other hand, a CIE chromaticity coordinate at luminance of 3000 cd/m$^2$ is (x, y)=(0.18, 0.73) in the light emitting element 1 and (x, y)=(0.28, 0.66) in the comparative element. Although the light emitting element 1 and the comparative element emit green light, it was verified that color purity of the light emitting element 1 is higher.

Figure 12:
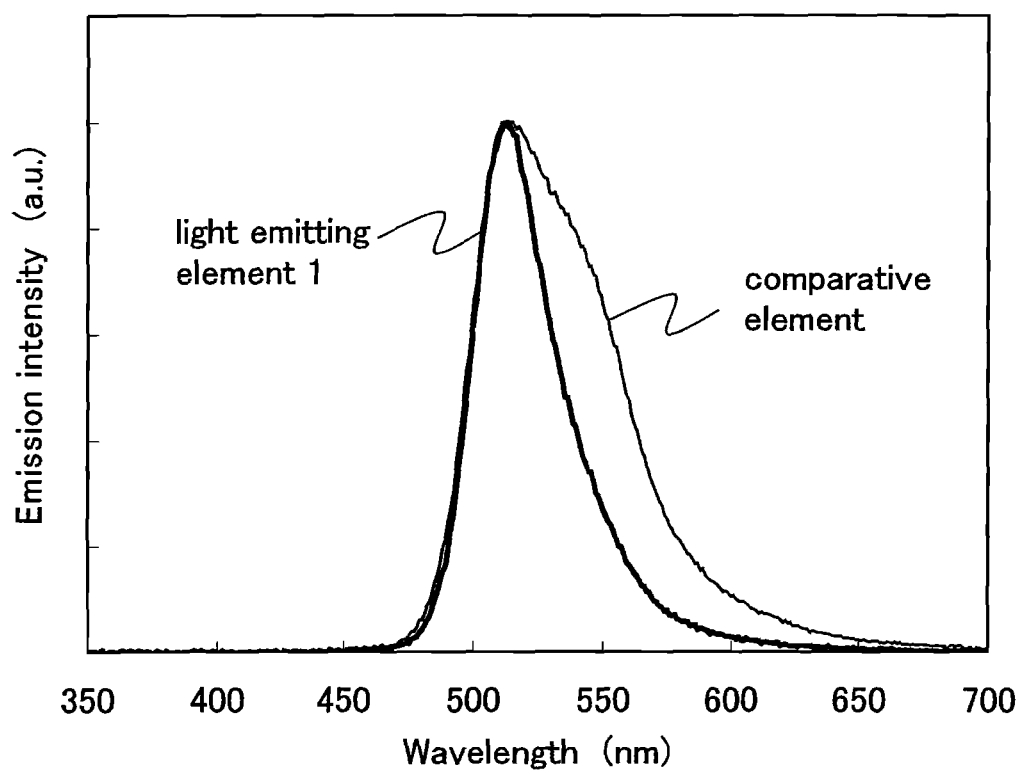
FIG. 12 is an emission spectrum of a light emitting element 1 and a comparative element (Embodiment 1)

FIG. 12 shows an emission spectrum of the light emitting element 1 and the comparative element. As shown in FIG. 12, an emission spectrum is sharper in the light emitting element 1. A half value width of an emission spectrum is 60 nm in the comparative element whereas 35 nm in the light emitting element 1. This leads to the improvement of color purity.

As shown in this embodiment, it was revealed that color purity can be improved without little influence on current density-luminance characteristics and voltage-luminance characteristics by providing a translucent electrode and a buffer layer in a light emitting element.

Embodiment 2

A light emitting element having a structure shown in FIG. 1C was manufactured over a glass substrate, and characteristics thereof were measured. In this embodiment, a light emitting element which is manufactured is referred to as "light emitting element 2". First, a structure of the light emitting element 2 and a manufacturing method thereof will be explained.

<First Electrode 400 (Reflective Electrode)>

The first electrode 400 was formed as a reflective electrode. Over a substrate, a conductive film was formed, in which alloy of aluminum and titanium (hereinafter, referred to as "Al—Ti") having a thickness of 40 nm is formed and Ti having a thickness of 6 nm is laminated over Al—Ti.

<Buffer Layer 401-1>

As the buffer layer 401-1, a composite material of DNTPD and MoOx was formed to have a thickness of 40 nm. In the same manner as the light emitting element 1, the composite material was formed by co-evaporating DNTPD and MoOx, and MoO$_3$ was used for an evaporation source of MoOx. A mass ratio was set to be DNTPD:MoOx=4:2.

<Light Emitting Laminated Body 402>

A light emitting laminated body 402 was formed to have three functional layers. First, NPB was formed to have a thickness of 10 nm over the composite material of DNTPD and MoOx. Coumarin 6 and Alq$_3$ were co-evaporated to have a thickness of 40 nm over NPB. A mass ratio was set to be coumarin 6:Alq$_3$=1:0.01. A composite material of coumarin 6 and Alq$_3$ functions as a light emitting layer. Alq$_3$ was evaporated to have a thickness of 10 nm over the composite material of coumarin 6 and Alq$_3$.

<Buffer Layer 401-2>

The buffer layer 401-2 was formed to have a two-layer structure of a layer having a function of generating electrons and a composite material layer of an organic compound having a hole transporting property and a metal compound. As the layer having a function of generating electrons, Alq$_3$ and Li were co-evaporated to have a thickness of 10 nm to form Alq$_3$ doped with Li. A mass ratio was set to be Alq$_3$:Li=1:0.01. A composite material of DNTPD and MoOx, which is the same as the buffer layer 401-1, was used as the composite material of an organic compound and a metal compound to have a thickness of 110 nm.

<Second Electrode 403 (Translucent Electrode)>

As the second electrode 403, Ag was evaporated to have a thickness of 25 nm over the composite material of DNTPD and MoOx. Ag was formed to be extremely thin; therefore, Ag could be made to function as a translucent electrode.

Also in the light emitting element 2, green emission was made to resonate in the same manner as the light emitting element 1. An optical design was conducted so that light with a wavelength of 513 nm is resonated. Thicknesses of the buffer layers 401-1 and 401-2, especially thicknesses of the composite material of DNTPD and MoOx were determined so as to optimize the distance between the first electrode 400 and the second electrode 403. The physical distance between the first electrode 400 and the second electrode 403 is 220 nm. Table 2 shows a material and a thickness of each layer included in the light emitting element 2.

TABLE 2

|  | light emitting element 2 |
| --- | --- |
| second electrode 403 | Ag (25 nm) |
| buffer layer 401-2 | DNTPD + MoOx (mass ratio = 4:2) (110 nm) |
| | Alq3 + Li (mass ratio = 1:0.01) (10 nm) |
| light emitting laminated body 402 | Alq3 (10 nm) |
| | Alq3 + coumarin6 (mass ratio = 1:0.01) (40 nm) |
| | NPB (10 nm) |
| buffer layer 401-1 | DNTPD + MoOx (mass ratio = 4:2) (40 nm) |
| first electrode 400 | Ti (6 nm) |
| | Al—Ti (40 nm) |

Figure 13A:
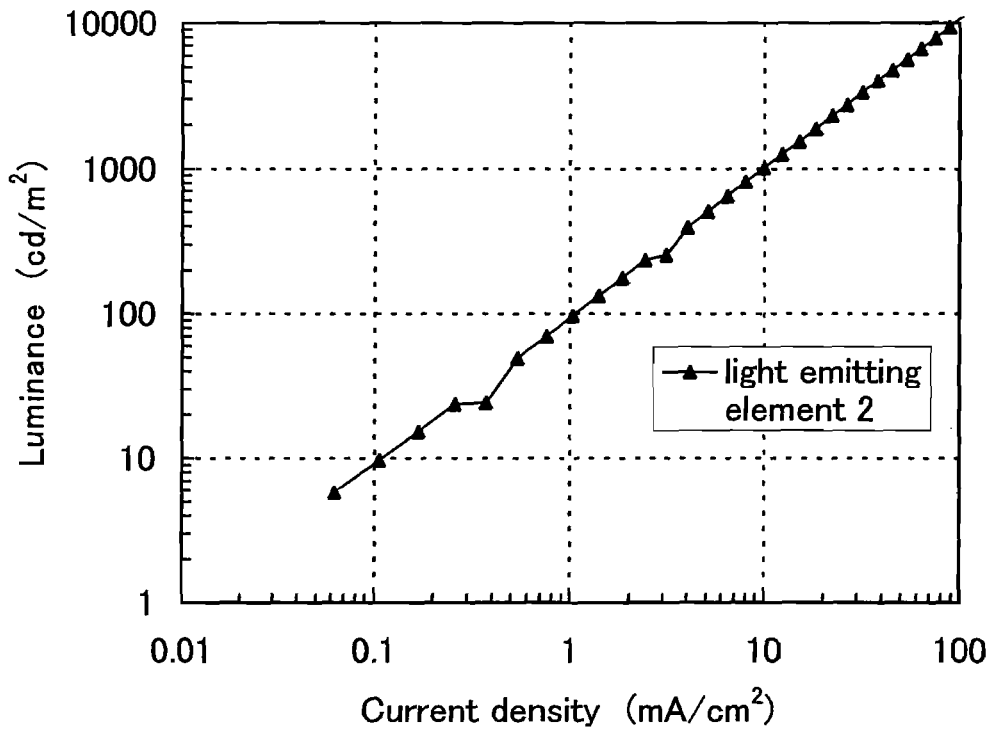
FIGS. 13A and 13B are a current density-luminance characteristics drawing and a voltage-luminance characteristics drawing of a light emitting element 2 (Embodiment 2)
Figure 13B:
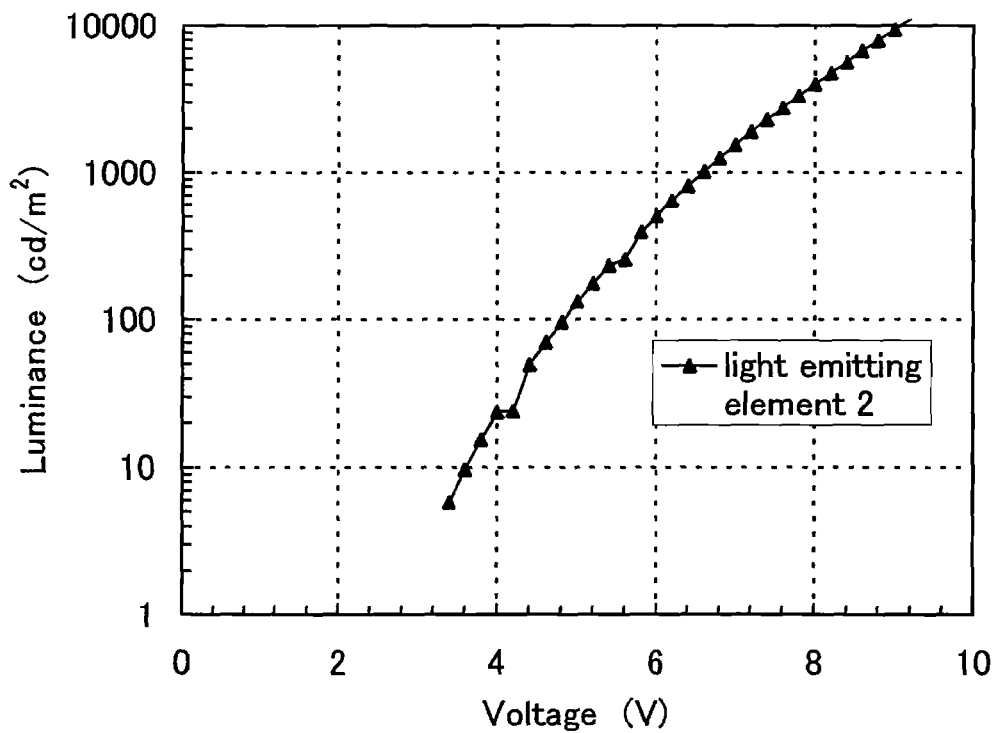

FIG. 13A shows current density-luminance characteristics and FIG. 13B shows voltage-luminance characteristics of the light emitting element 2. Current efficiency at luminance of 3000 cd/m$^2$ is 10.4 cd/A, which showed favorable current efficiency.

In addition, a CIE chromaticity coordinate at luminance of 3000 cd/m$^2$ is (x, y)=(0.20, 0.72), and green light having high color purity could be obtained from the light emitting element 2.

Figure 14:
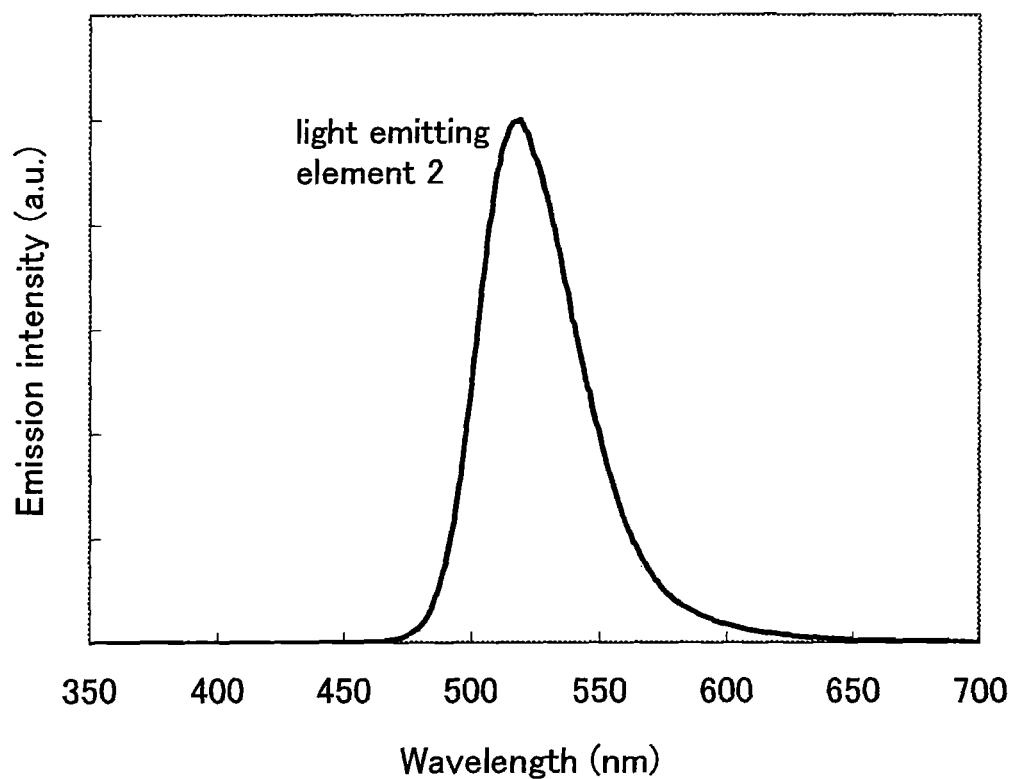
FIG. 14 is an emission spectrum of a light emitting element 2 (Embodiment 2).

FIG. 14 shows an emission spectrum of the light emitting element 2. As shown in FIG. 14, an emission spectrum shows a sharp peak and a half value width of an emission spectrum is 45 nm. This leads to the improvement of color purity.

Table 3 shows current efficiency, a CIE chromaticity coordinate, and a half value width of an emission spectrum with respect to the light emitting element 1 and the comparative element shown in Embodiment 1 as well as the light emitting element 2. Current efficiency and a CIE chromaticity coordinate in Table 3 is a value at luminescence of 3000 cd/m².

TABLE 3

|  | Current efficiency [cd/A] | CIE chromaticity coordinate (x, y) | half value width [nm] |
| --- | --- | --- | --- |
| light emitting element 1 | 10.6 | (0.18, 0.73) | 35 |
| light emitting element 2 | 10.4 | (0.20, 0.72) | 45 |
| comparative element | 11.3 | (0.28, 0.66) | 60 |

As shown in this embodiment, it is revealed that color purity can be improved without little influence on current density-luminance characteristics and voltage-luminance characteristics by providing a buffer layer and a translucent electrode in a light emitting element. In the light emitting element 2, the distance between the first electrode and the second electrode is longer than the light emitting element 1 and the comparative element because two buffer layers are provided; however, color purity is improved more than the comparative element by a resonance effect without lowering current density-luminance characteristics and voltage-luminance characteristics, and the improvement of color purity which is equivalent to the light emitting element 1 was obtained.

In addition, in the light emitting element 2, an electrode made of titanium or titanium alloy having reflectance which is not higher than Ag is used as a reflective electrode (second electrode 403); however, the improvement of color purity by a resonance effect could be verified according to this embodiment. Titanium or titanium alloy is a wiring material or an electrode material which is preferably used for an active matrix light emitting device (refer to Embodiment Modes 2 and 3). Therefore, in a case where a wiring or an electrode to be formed in a pixel portion is made of titanium or titanium alloy, it was revealed that a resonance effect can be obtained while these wiring and electrode are used for one of the electrodes of the light emitting element. For example, in the active matrix light emitting device shown in Embodiment Mode 2, a connection portion 61a of a thin film transistor can be used for a first electrode 64 of a light emitting element (refer to FIGS. 2A to 2E and FIG. 4).

Therefore, in a top emission structure as shown in this embodiment, it was revealed that the present invention was very effective to be applied also from the aspect of the simplification of a process.

This application is based on Japanese Patent Application serial No. 2005-191868 field in Japan Patent Office on Jun. 30, 2005, the entire contents of which are hereby incorporated by reference.

What is claimed is:
1. A light emitting device comprising:
a first pixel and a second pixel which neighbors to the first pixel, the first pixel and the second pixel each comprising an anode;
a partition wall between the first pixel and the second pixel, the partition wall covering edge portions of the anodes of the first and second pixels;
a first film over the anode of the first pixel and the partition wall;
a second film over the anode of the second pixel and the partition wall;
a third film over the first film and the second film, the third film overlapping the anodes of the first and second pixels and the partition wall; and
a cathode over the third film, the cathode being shared by the first pixel and the second pixel,
wherein the first film and the second film each comprise a first organic compound,
wherein the third film comprises a second organic compound having a hole transporting property,
wherein the third film is in direct contact with the partition wall, a top surface of the first film, and a top surface of the second film,
wherein each of the first film and the second film has a first thickness and a second thickness respectively so that each of a first distance between the anode of the first pixel and the cathode and a second distance between the anode of the second pixel and the cathode satisfies a formula (1),

$$Lp = \frac{1}{n_\lambda} \times \frac{\lambda}{2} m \qquad (1)$$

wherein Lp represents a physical distance between the cathode and the anode of each of the first pixel and the second pixel,
wherein λ represents a maximum wavelength of light emitted from each of the first pixel and the second pixel,
wherein $n_\lambda$ represents a refractive index of films between the cathode and the anode of each of the first pixel and the second pixel at a wavelength of λ,
wherein m represents an integer, and
wherein the first thickness and the second thickness are different from each other.
2. The light emitting device according to claim 1,
wherein the third film is shared by the first pixel and the second pixel.
3. The light emitting device according to claim 1,
wherein the first film and the second film are each in direct contact with the anodes of the first and second pixels, respectively.
4. The light emitting device according to claim 1,
wherein the first film and the second film are each a hole injecting layer, and
wherein the third film is a hole transporting layer.
5. The light emitting device according to claim 1,
wherein the first film and the second film each comprise the first organic compound and a transition metal oxide.
6. The light emitting device according to claim 5,
wherein the first organic compound has a hole transporting property, and
wherein the transition metal oxide is molybdenum oxide.
7. The light emitting device according to claim 1,
wherein the first film and the second film are spaced from each other.

8. An electronic device comprising the light emitting device according to claim 1.

9. A light emitting device comprising:
- a first pixel and a second pixel which neighbors to the first pixel, the first pixel and the second pixel each comprising an anode;
- a partition wall between the first pixel and the second pixel, the partition wall covering edge portions of the anodes of the first and second pixels;
- a first film over the anode of the first pixel and the partition wall;
- a second film over the anode of the second pixel and the partition wall;
- a third film over the first film and the second film, the third film overlapping the anodes of the first and second pixels and the partition wall;
- a fourth film and a fifth film each over the third film, the fourth film and the fifth film overlapping the anode of the first pixel and the anode of the second pixel, respectively; and
- a cathode over the fourth film and the fifth film, the cathode being shared by the first pixel and the second pixel,
- wherein the first film and the second film each comprise a first organic compound,
- wherein the third film comprises a second organic compound having a hole transporting property,
- wherein the third film is in direct contact with the partition wall,
- wherein each of the first film and the second film has a first thickness and a second thickness respectively so that each of a first distance between the anode of the first pixel and the cathode and a second distance between the anode of the second pixel and the cathode satisfies a formula (1), $$Lp = \frac{1}{n_\lambda} \times \frac{\lambda}{2} m \qquad (1)$$

- wherein Lp represents a physical distance between the cathode and the anode of each of the first pixel and the second pixel,
- wherein $\lambda$ represents a maximum wavelength of light emitted from each of the first pixel and the second pixel,
- wherein $n_\lambda$ represents a refractive index of films between the cathode and the anode of each of the first pixel and the second pixel at a wavelength of $\lambda$,
- wherein m represents an integer, and
- wherein the first thickness and the second thickness are different from each other.

10. The light emitting device according to claim 9,
- wherein the third film is shared by the first pixel and the second pixel.

11. The light emitting device according to claim 9,
- wherein the first film and the second film are each in direct contact with the anodes of the first and second pixels, respectively.

12. The light emitting device according to claim 9,
- wherein the first film and the second film are each a hole injecting layer, and
- wherein the third film is a hole transporting layer.

13. The light emitting device according to claim 9,
- wherein the first film and the second film each comprise the first organic compound and a transition metal oxide.

14. The light emitting device according to claim 13,
- wherein the first organic compound has a hole transporting property, and
- wherein the transition metal oxide is molybdenum.

15. The light emitting device according to claim 9,
- wherein the third film is in direct contact with the first film and the second film.

16. The light emitting device according to claim 9,
- wherein the first film and the second film are spaced from each other.

17. The light emitting device according to claim 9,
- wherein the fourth film and the fifth film are spaced from each other.

18. The light emitting device according to claim 9,
- wherein the fourth film and the fifth film are different in emission color from each other.

19. An electronic device comprising the light emitting device according to claim 9.

* * * * *